(12) United States Patent
Leem et al.

(10) Patent No.: US 10,976,195 B2
(45) Date of Patent: Apr. 13, 2021

(54) COMBINATION SENSORS AND ELECTRONIC DEVICES

(71) Applicant: Samsung Electronics Co., Ltd., Suwon-si (KR)

(72) Inventors: Dong-Seok Leem, Hwaseong-si (KR); Gae Hwang Lee, Seongnam-si (KR); Yong Wan Jin, Seoul (KR); Tae Yon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 229 days.

(21) Appl. No.: 16/165,014

(22) Filed: Oct. 19, 2018

(65) Prior Publication Data

US 2019/0120689 A1 Apr. 25, 2019

(30) Foreign Application Priority Data

Oct. 20, 2017 (KR) .................. 10-2017-0136255
Oct. 15, 2018 (KR) .................. 10-2018-0122638

(51) Int. Cl.
*G01J 1/42* (2006.01)
*H01L 27/146* (2006.01)
(Continued)

(52) U.S. Cl.
CPC .............. *G01J 1/4228* (2013.01); *G01J 1/04* (2013.01); *G01J 1/0488* (2013.01); *G01J 1/42* (2013.01);
(Continued)

(58) Field of Classification Search
CPC .......... G01J 1/4228; G01J 1/42; G01J 1/0488; G01J 1/0418; H01L 27/1462;
(Continued)

(56) References Cited

U.S. PATENT DOCUMENTS 5,373,182 A 12/1994 Norton
6,184,538 B1 * 2/2001 Bandara ................ B82Y 20/00
250/338.4

(Continued)

FOREIGN PATENT DOCUMENTS

EP 0959769 A1 12/1999
JP 6075644 B2 2/2017
(Continued)

OTHER PUBLICATIONS

Extended European Search Report dated Jul. 11, 2019 for corresponding European Application No. 18201308.6.
(Continued)

*Primary Examiner* — David P Porta
*Assistant Examiner* — Gisselle M Gutierrez
(74) *Attorney, Agent, or Firm* — Harness, Dickey & Pierce, P.L.C.

(57) ABSTRACT

A combination sensor may include a first infrared light sensor and a second infrared light sensor. The first infrared light sensor may be configured to sense light in a first wavelength within an infrared wavelength spectrum. The second infrared light sensor may be configured to sense light in a second wavelength that is different from the first wavelength within the infrared wavelength spectrum. The first infrared light sensor and the second infrared light sensor may be stacked in relation to each other.

30 Claims, 14 Drawing Sheets

(51) Int. Cl.
*G06K 9/20* (2006.01)
*G01J 1/04* (2006.01)
*G01J 1/44* (2006.01)
*G06K 9/00* (2006.01)
*H01L 27/30* (2006.01)

(52) U.S. Cl.
CPC ............ *G01J 1/44* (2013.01); *G06K 9/00604* (2013.01); *G06K 9/2018* (2013.01); *H01L 27/1462* (2013.01); *H01L 27/14652* (2013.01); *H01L 27/14669* (2013.01); *H01L 27/307* (2013.01)

(58) Field of Classification Search
CPC ......... H01L 27/14669; H01L 27/14652; H01L 27/307; H01L 27/1463; H01L 27/14636; H01L 27/14645; G06K 9/2018; G06K 9/00604; G06K 9/0061; G06K 9/00617
USPC ...................................................... 250/338.4
See application file for complete search history.

(56) References Cited

U.S. PATENT DOCUMENTS

| | | | |
|---|---|---|---|
| 9,504,384 | B2 | 11/2016 | Toda |
| 10,008,544 | B2 | 6/2018 | Park et al. |
| 2002/0030755 | A1 | 3/2002 | Uchino |
| 2014/0098192 | A1 | 4/2014 | Park et al. |
| 2014/0183337 | A1 | 7/2014 | Hu |
| 2015/0130708 | A1* | 5/2015 | Kang .................... G06F 3/0304 345/156 |
| 2015/0287766 | A1* | 10/2015 | Kim .................. H01L 27/14641 250/208.1 |
| 2016/0087001 | A1 | 3/2016 | Tennant et al. |
| 2016/0260206 | A1 | 9/2016 | Jung et al. |
| 2017/0045354 | A1 | 2/2017 | Toda |
| 2017/0147879 | A1 | 5/2017 | Alameh et al. |
| 2017/0243913 | A1 | 8/2017 | Lee et al. |

FOREIGN PATENT DOCUMENTS

| | | |
|---|---|---|
| KR | 2015-0054430 A | 5/2015 |
| KR | 2016-0108076 A | 9/2016 |
| KR | 2017-0000547 A | 1/2017 |
| KR | 2017-0099657 A | 9/2017 |

OTHER PUBLICATIONS

European Search Report dated Mar. 8, 2019 for corresponding European Application No. 18201308.6.

* cited by examiner

COMBINATION SENSORS AND ELECTRONIC DEVICES

CROSS-REFERENCE TO RELATED APPLICATION

This application claims priority to and the benefit, under 35 U.S.C. § 119, of Korean Patent Application No. 10-2017-0136255, filed in the Korean Intellectual Property Office on Oct. 20, 2017, and Korean Patent Application No. 10-2018-0122638, filed in the Korean Intellectual Property Office on Oct. 15, 2018, the entire contents of each of which are incorporated herein by reference.

BACKGROUND

1. Field

Combination sensors and electronic devices are disclosed.

2. Description of the Related Art

A sensor configured to take ("capture") an image and store the image as an electrical signal may be included in a camera, a camcorder, and the like. Recently, technology of using a sensor as a biometric device has been researched. Biometric devices were mainly used as personal authentication devices but have recently drawn attention as security technology for a service such as financial technology, health care, location-based services, and the like and are being broadly used up to a mobile payment and computer security.

SUMMARY

Some example embodiments provide combination sensors capable of improving sensitivity without increasing size of the combination sensors.

Some example embodiments provide electronic devices including one or more combination sensors.

According to some example embodiments, a combination sensor may include a first infrared light sensor configured to sense light associated with a first wavelength within an infrared wavelength spectrum; and a second infrared light sensor configured to sense light associated with a second wavelength within the infrared wavelength spectrum. The first infrared light sensor and the second infrared light sensor may be stacked in relation to each other.

The first wavelength and the second wavelength may each be within a wavelength spectrum of about 750 nm to about 3000 nm, and a difference between the first wavelength and the second wavelength may be greater than or equal to about 30 nm.

The first wavelength may be a shorter wavelength than the second wavelength, the first wavelength may be within a wavelength spectrum of about 780 nm to about 900 nm, and the second wavelength may be within a wavelength spectrum of about 830 nm to about 1000 nm.

The first wavelength may be within a wavelength spectrum of about 780 nm to about 840 nm, and the second wavelength may be within a wavelength spectrum of about 910 nm to about 970 nm.

The first infrared light sensor may include a first electrode and a second electrode facing each other, and a first photoelectric conversion layer between the first electrode and the second electrode, the first photoelectric conversion layer including a first light absorbing material configured to selectively absorb infrared light including the first wavelength.

The first light absorbing material may include an organic material configured to selectively absorb infrared light including the first wavelength, a semiconductor nanocrystal configured to selectively absorb infrared light including the first wavelength, or a combination thereof.

The first photoelectric conversion layer may be associated with an absorptance at the first wavelength that is greater than or equal to about 50%, and the first photoelectric conversion layer may be associated with a transmittance at the second wavelength that is greater than or equal to about 50%.

The second infrared light sensor may be a photo-sensing device integrated in a semiconductor substrate.

The second infrared light sensor may include a third electrode and a fourth electrode facing each other, and a second photoelectric conversion layer between the third electrode and the fourth electrode, the second photoelectric conversion layer including a second light absorbing material configured to selectively absorb infrared light including the second wavelength.

The second light absorbing material included in the second photoelectric conversion layer may include an organic material configured to selectively absorb infrared light including the second wavelength, a semiconductor nanocrystal configured to selectively absorb infrared light including the second wavelength, or a combination thereof.

The second infrared light sensor may include a first electrode and a second electrode facing each other, and a first photoelectric conversion layer may be between the first electrode and the second electrode, the first photoelectric conversion layer including a second light absorbing material configured to selectively absorb infrared light including the second wavelength.

The light absorbing material included in the first photoelectric conversion layer may include an organic material configured to selectively absorb infrared light including the second wavelength, a semiconductor nanocrystal configured to selectively absorb infrared light including the second wavelength, or a combination thereof.

The first photoelectric conversion layer may be associated with an absorptance at the second wavelength that is greater than or equal to about 50%, and the first photoelectric conversion layer may be associated with a transmittance at the first wavelength that is greater than or equal to about 50%.

The first infrared light sensor may be a photo-sensing device integrated in a semiconductor substrate.

The first infrared light sensor may include a third electrode and a fourth electrode facing each other, and a second photoelectric conversion layer between the third electrode and the fourth electrode, the second photoelectric conversion layer including a light absorbing material configured to selectively absorb infrared light including the first wavelength.

The second light absorbing material included in the second photoelectric conversion layer may include an organic material configured to selectively absorb infrared light including the first wavelength, a semiconductor nanocrystal configured to selectively absorb infrared light including the first wavelength, or a combination thereof.

At least one infrared light sensor of the first infrared light sensor and the second infrared light sensor may include a first electrode and a second electrode facing each other, and a photoelectric conversion layer between the first electrode and the second electrode, the photoelectric conversion layer including a light absorbing material configured to selectively absorb infrared light including the first wavelength, or infrared light including the second wavelength.

The first infrared light sensor and the second infrared light sensor may be stacked in a vertical direction that extends substantially orthogonal to an upper surface of the first infrared light sensor, such that the first infrared light sensor and the second infrared light sensor overlap in the vertical direction.

The combination sensor may further include a dual bandpass filter configured to selectively transmit infrared light including the first wavelength and the second wavelength.

The combination sensor may include a plurality of pixels, and each pixel of the plurality of pixels may include the first infrared light sensor and the second infrared light sensor.

Each infrared light sensor of the first infrared light sensor and the second infrared light sensor may be a biometric sensor.

The first infrared light sensor may be an iris sensor. The second infrared light sensor may be a depth sensor.

According to some example embodiments, a combination sensor may include a plurality of pixels, wherein each pixel includes an iris sensor and a depth sensor.

The iris sensor and the depth sensor may be stacked, wherein the iris sensor is configured to selectively sense infrared light including a first wavelength, and the depth sensor is configured to selectively sense infrared light including a second wavelength.

At least one sensor of the iris sensor and the depth sensor may include a first electrode and a second electrode facing each other, and a photoelectric conversion layer between the first electrode and the second electrode, the photoelectric conversion layer including a light absorbing material configured to selectively absorb infrared light including the first wavelength or infrared light including the second wavelength.

An electronic device may include the combination sensor.

According to some example embodiments, an electronic device may include at least one light source configured to irradiate light of a first wavelength and light of a second wavelength that is different from the first wavelength, a first sensor configured to sense reflected light of the first wavelength, and a second sensor stacked with the first sensor and configured to sense reflected light of the second wavelength.

The at least one light source may include a first light source configured to irradiate light of the first wavelength and a second light source to irradiate light of the second wavelength.

The light of the first wavelength and the light of the second wavelength may each be within an infrared wavelength spectrum.

The first wavelength and the second wavelength may each be within a wavelength spectrum of about 750 nm to about 3000 nm, and a difference between the first wavelength and the second wavelength is greater than or equal to about 30 nm.

The first wavelength may be a shorter wavelength than the second wavelength, the first wavelength may be within a wavelength spectrum of about 780 nm to about 900 nm, and the second wavelength may be within a wavelength spectrum of about 830 nm to about 1000 nm.

The first wavelength may be within a wavelength spectrum of about 780 nm to about 840 nm, the second wavelength may be within a wavelength spectrum of about 910 nm to about 970 nm.

According to some example embodiments, a combination sensor may include a first infrared light sensor configured to sense light associated with a first wavelength within an infrared wavelength spectrum; and a second infrared light sensor configured to sense light associated with a second wavelength within the infrared wavelength spectrum, the second wavelength different from the first wavelength. The first infrared light sensor and the second infrared light sensor may be stacked in relation to each other.

The first infrared light sensor and the second infrared light sensor may be stacked in a vertical direction that extends substantially orthogonal to an upper surface of the first infrared light sensor, such that the first infrared light sensor and the second infrared light sensor overlap in the vertical direction.

The first infrared light sensor and the second infrared light sensor may be stacked in a horizontal direction that extends substantially parallel to an upper surface of the first infrared light sensor, such that the first infrared light sensor and the second infrared light sensor overlap in the horizontal direction and respective upper surfaces of the first and second infrared light sensors establish a substantially coplanar upper surface.

At least one infrared light sensor of the first infrared light sensor and the second infrared light sensor may include a first electrode and a second electrode facing each other, and a photoelectric conversion layer between the first electrode and the second electrode, the photoelectric conversion layer including a light absorbing material configured to selectively absorb infrared light including the first wavelength, or infrared light including the second wavelength.

At least one infrared light sensor of the first infrared light sensor and the second infrared light sensor may include a first electrode and a second electrode facing each other, and a photoelectric conversion layer between the first electrode and the second electrode, the photoelectric conversion layer including a light absorbing material configured to selectively absorb infrared light including the first wavelength, or infrared light including the second wavelength.

The first infrared light sensor may include the first electrode and the second electrode facing each other, and a first photoelectric conversion layer between the first electrode and the second electrode, the first photoelectric conversion layer including a first light absorbing material configured to selectively absorb infrared light including the first wavelength. The second infrared light sensor may include the first electrode and the second electrode facing each other, and a second photoelectric conversion layer between the first electrode and the second electrode, the second photoelectric conversion layer including a second light absorbing material configured to selectively absorb infrared light including the second wavelength.

Each infrared light sensor of the first infrared light sensor and the second infrared light sensor may be a photo-sensing device integrated in a semiconductor substrate.

The first infrared light sensor may include the first electrode and the second electrode facing each other, and a first photoelectric conversion layer between the first electrode and the second electrode, the first photoelectric conversion layer including a first light absorbing material configured to selectively absorb infrared light including the first wavelength. The second infrared light sensor may be between the first infrared light sensor and a light incidence side of the combination sensor.

DETAILED DESCRIPTION

Figure 1:
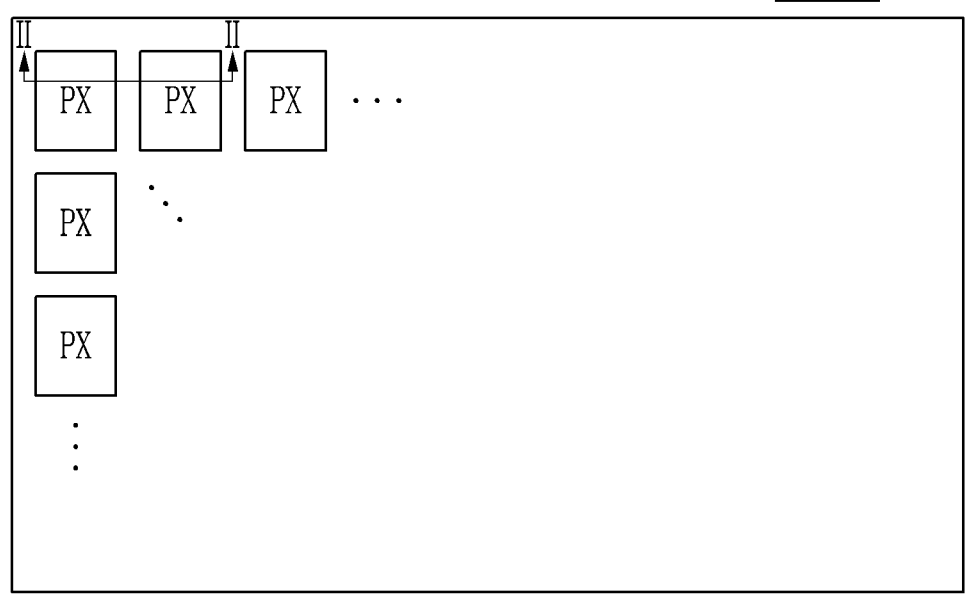
FIG. 1 is a schematic view showing a pixel arrangement of a combination sensor according to some example embodiments.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a combination sensor according to some example embodiments is described.

A combination sensor according to some example embodiments may include a plurality of sensors having different functions. For example, at least one of the plurality of sensors having different functions may be a biometric sensor, and the biometric sensor may be for example an iris sensor, a depth sensor, a fingerprint sensor, a blood vessel distribution sensor, and the like, but is not limited thereto.

Among these biometric sensors, the iris sensor may identify a person by using unique iris characteristics of every person and specifically, taking an image of an eye of a user within an appropriate distance, processing the image, and comparing it with his/her stored image.

The depth sensor may identify a shape and a location of an object from its three-dimensional information by taking an image of the object within an appropriate distance with a user and processing the image. This depth sensor may be for example used as a face recognition sensor.

Figure 2:
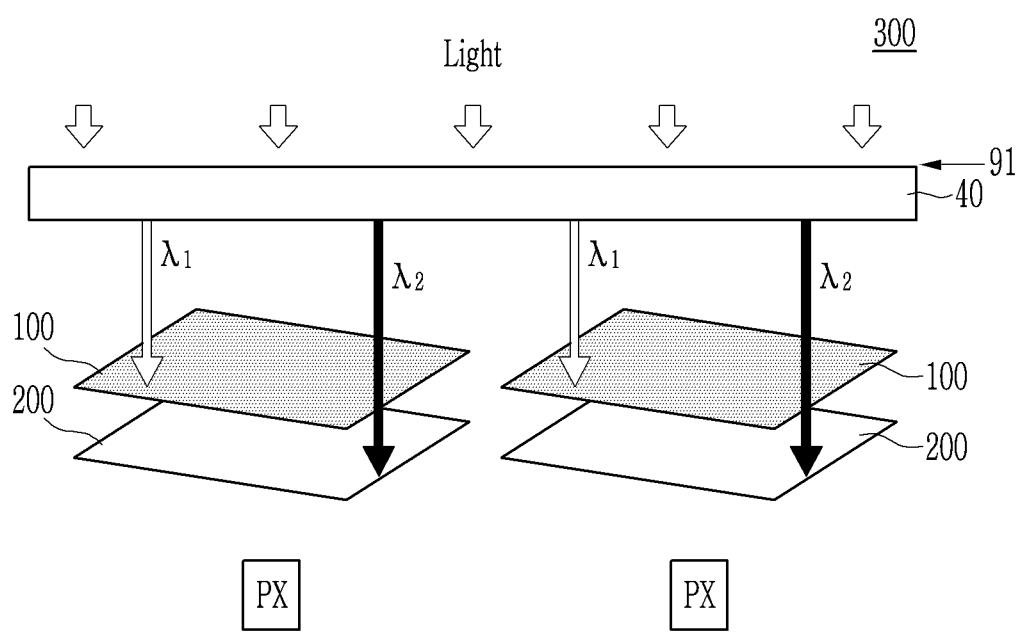
FIG. 2 is a schematic view showing a combination sensor according to some example embodiments corresponding to a section taken along the line II-II of FIG. 1.

FIG. 1 is a schematic view showing a pixel arrangement of a combination sensor according to some example embodiments and FIG. 2 is a schematic view showing a combination sensor according to some example embodiments corresponding to a section taken along the line II-II of FIG. 1.

Referring to FIG. 1, a combination sensor 300 according to some example embodiments may have a matrix arrangement of a plurality of pixels (PX) wherein the pixels are repetitively arranged along a column and/or a row. However, this pixel arrangement is not limited thereto but may be variously modified.

At least a part of the pixels may include a plurality of sensors having each different function inside one pixel, and for example, each pixel (PX) may include a plurality of sensors having a different function one another. Each of the plurality of sensors may be configured to selectively sense light in a part of a wavelength spectrum in an infrared wavelength spectrum, wherein the infrared wavelength spectrum may include for example a near infrared wavelength spectrum, for example a wavelength spectrum of greater than about 700 nm and less than or equal to about 3000 nm, a wavelength spectrum of greater than about 700 nm and less than or equal to about 1500 nm, a wavelength spectrum of about 750 nm to about 3000 nm, or a wavelength spectrum of about 750 nm to about 1500 nm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The plurality of sensors may include for example a first infrared light sensor configured to sense ("absorb") light of an infrared region ("infrared wavelength spectrum") having ("including") the first wavelength ($\lambda_1$) within an infrared wavelength spectrum (hereinafter, referred to as 'infrared light') and a second infrared light sensor configured to sense light of ("associated with") an infrared region having the second wavelength ($\lambda_2$) within an infrared wavelength spectrum.

The first wavelength ($\lambda_1$) and the second wavelength ($\lambda_2$) may be for example different in a wavelength spectrum of about 750 nm to about 3000 nm, and for example a difference between the first wavelength ($\lambda_1$) and the second wavelength ($\lambda_2$) may be greater than or equal to about 30 nm, greater than or equal to about 50 nm, greater than or equal to about 70 nm, greater than or equal to about 80 nm, or greater than or equal to about 90 nm.

One of the first wavelength ($\lambda_1$) and the second wavelength ($\lambda_2$) may belong to a wavelength spectrum of about 780 nm to about 900 nm and the other of the first wavelength ($\lambda_1$) and the second wavelength ($\lambda_2$) may belong to a wavelength spectrum of about 830 nm to about 1000 nm.

One of the first wavelength ($\lambda_1$) and the second wavelength ($\lambda_2$) may belong to a wavelength spectrum of about 780 nm to about 840 nm and the other of the first wavelength ($\lambda_1$) and the second wavelength ($\lambda_2$) may belong to a wavelength spectrum of about 910 nm to about 970 nm.

One of the first wavelength ($\lambda_1$) and the second wavelength ($\lambda_2$) may belong to a wavelength spectrum of about 800 nm to about 830 nm and the other of the first wavelength ($\lambda_1$) and the second wavelength ($\lambda_2$) may belong to a wavelength spectrum of about 930 nm to about 950 nm.

One wavelength of the first wavelength ($\lambda_1$) and the second wavelength ($\lambda_2$) may belong to a wavelength spectrum of about 805 nm to about 815 nm and the other of the first wavelength ($\lambda_1$) and the second wavelength ($\lambda_2$) may belong to a wavelength spectrum of about 935 nm to about 945 nm.

One wavelength of the first wavelength ($\lambda_1$) and the second wavelength ($\lambda_2$) may about 810 nm and the other of the first wavelength ($\lambda_1$) and the second wavelength ($\lambda_2$) may be about 940 nm.

The first wavelength ($\lambda_1$) may be a shorter wavelength than the second wavelength ($\lambda_2$). The first wavelength ($\lambda_1$) may belong to ("may be within") a wavelength spectrum of about 780 nm to about 900 nm, for example about 780 nm to about 840 nm, about 800 nm to about 830 nm, about 805 nm to about 815 nm and the second wavelength ($\lambda_2$) may belong to ("may be within") a wavelength spectrum of about 830 nm to about 1000 nm, for example about 910 nm to about 970 nm, about 930 nm to about 950 nm, or about 935 nm to about 945 nm. For example, the first wavelength ($\lambda_1$) may be about 810 nm, and the second wavelength ($\lambda_2$) may be about 940 nm.

Referring to FIG. 2, a combination sensor 300 according to some example embodiments includes a first infrared light sensor 100, a second infrared light sensor 200, and a dual bandpass filter 40.

The dual bandpass filter 40 may be disposed ("located") at a front side ("light incidence side 91") of the combination sensor 300 and may be configured to selectively transmit infrared light including the first wavelength ($\lambda_1$) and infrared light including the second wavelength ($\lambda_2$) and may block and/or absorb other light. Herein, other light may include light in an ultraviolet (UV) and visible region ("wavelength spectrum").

The first infrared light sensor 100 and the second infrared light sensor 200 may be stacked and the same structure may be included in each pixel (PX).

The first infrared light sensor 100 and the second infrared light sensor 200 may independently be a photoelectric conversion device (photoelectric device) or a photo-sensing device such as a photodiode.

Each infrared light sensor of the first infrared light sensor 100 and the second infrared light sensor 200 may be independently a biometric sensor. One infrared light sensor of the first infrared light sensor 100 or the second infrared light sensor 200 may be an iris sensor and the other infrared light sensor of the first infrared light sensor 100 or the second infrared light sensor 200 may be a depth sensor. In each pixel PX of a combination sensor 300 that includes multiple pixels PX may include a first infrared light sensor 100 and a second infrared light sensor 200, where the first infrared light sensor 100 may be an iris sensor and the second infrared light sensor 200 may be a depth sensor.

Figure 3:
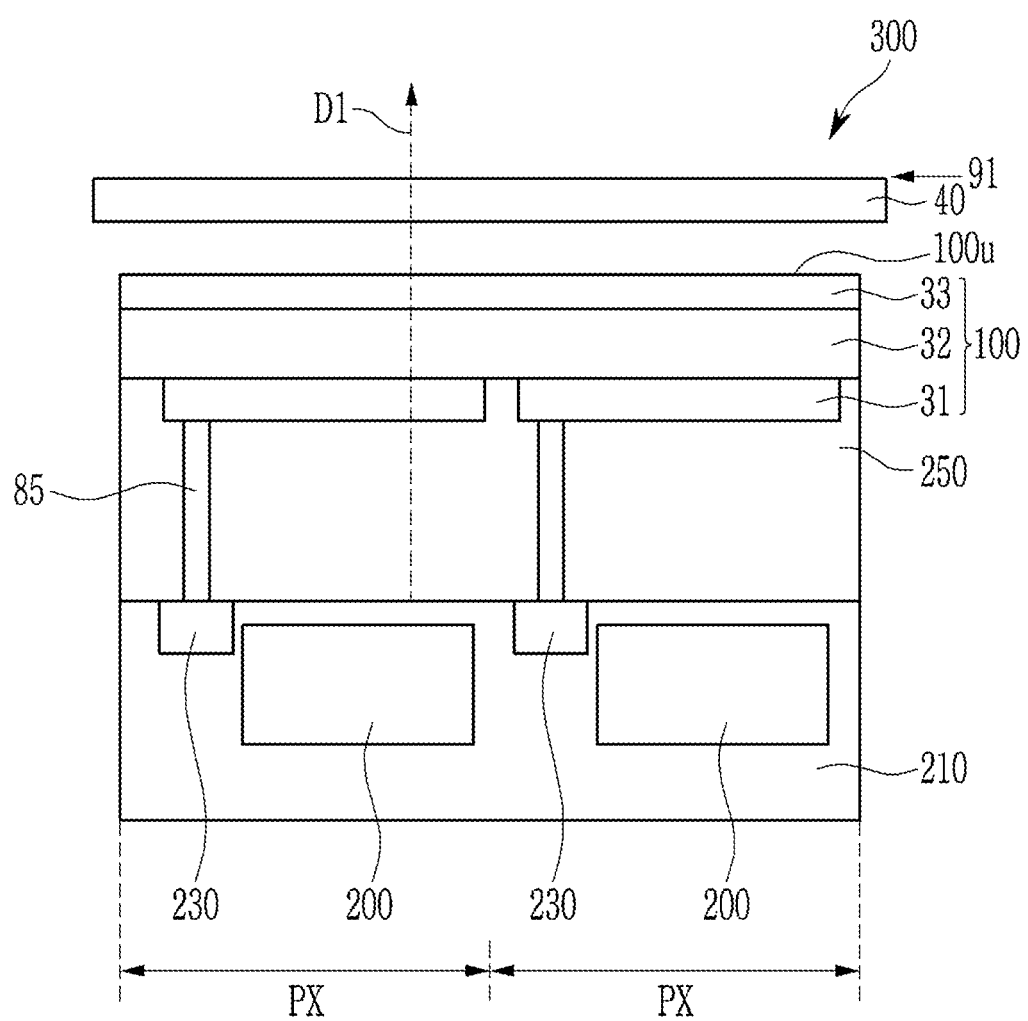
FIG. 3 is a schematic cross-sectional view showing a structure according to some example embodiments of the combination sensor of FIG. 2.
Figure 4:
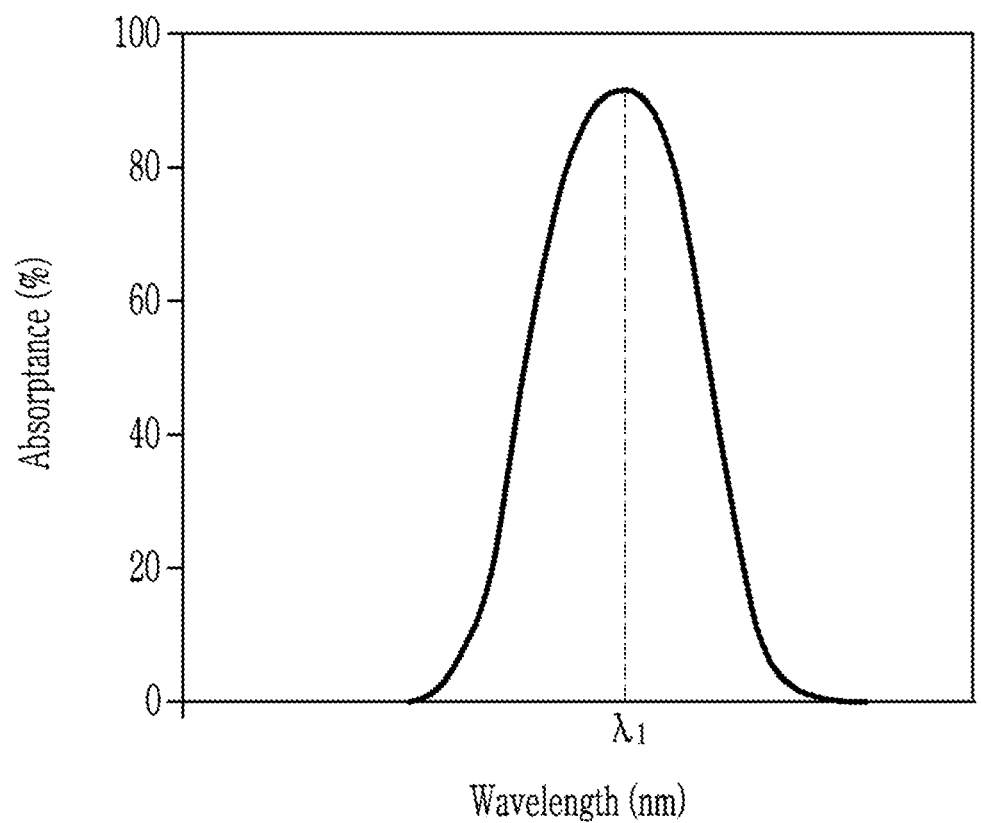
FIG. 4 is a graph showing one example of a light absorbance spectrum of the photoelectric conversion layer in the combination sensor of FIG. 3.

FIG. 3 is a schematic cross-sectional view showing a structure according to some example embodiments of the combination sensor of FIG. 2. FIG. 4 is a graph showing one example of a light absorbance spectrum of the photoelectric conversion layer in the combination sensor of FIG. 3.

Referring to FIG. 3, a combination sensor 300 according to some example embodiments includes a first infrared light sensor 100 and a second infrared light sensor 200 that are stacked (e.g., stacked in relation to each other), and a dual bandpass filter 40. As referred to herein, an element that is "stacked" on another element may be on the other element such that both "stacked" elements extend in parallel or substantially in parallel with each other (e.g., parallel within manufacturing tolerances and/or material tolerances). As shown in FIG. 3, at least the first and second infrared light sensors 100 and 200 are stacked with regard to each other. As referred to herein, where the first infrared light sensor 100 and the second infrared light sensor 200 that are referred to as being stacked, it will be understood that the first infrared light sensor 100 and the second infrared light sensor 200 are stacked in a vertical direction D1 that extends orthogonal or substantially orthogonal (e.g., orthogonal within manufacturing tolerances and/or material tolerances) to an upper surface 100U of the first infrared light sensor 100, such that the first infrared light sensor 100 and the second infrared light sensor 200 overlap in the vertical direction D1. The first infrared light sensor 100 may be a photoelectric conversion device that absorbs and photoelectrically converts infrared light including the first wavelength ($\lambda_1$) and the second infrared light sensor 200 may be a photo-sensing device. The photo-sensing device may be configured to sense light that passes the dual bandpass filter 40 and the first infrared light sensor 100, that is, infrared light including the second wavelength ($\lambda_2$). Accordingly, the first infrared light sensor 100 may be configured to sense light associated with a first wavelength ($\lambda_1$) within an infrared wavelength spectrum, and the second infrared light sensor 200 may be configured to sense light associated with a second wavelength ($\lambda_2$) within the infrared wavelength spectrum.

The first infrared light sensor 100 includes a lower electrode 31 ("first electrode") and an upper electrode 33 ("second electrode") facing each other and a photoelectric conversion layer 32 ("first photoelectric conversion layer") between the lower electrode 31 and the upper electrode 33.

One of the lower electrode 31 and the upper electrode 33 is an anode and the other is a cathode. Both of the lower electrode 31 and the upper electrode 33 may be a light-transmitting electrode, and the light-transmitting electrode may be made of, for example, a transparent conductor such as indium tin oxide (ITO) or indium zinc oxide (IZO), or may be a metal thin layer having a thin thickness of several nanometers or several tens of nanometers or a metal thin layer of a monolayer or a plural layer having a thin thickness of several nanometers to several tens of nanometers doped with a metal oxide.

The photoelectric conversion layer 32 may include a first light absorbing material configured to selectively absorb infrared light of a particular (or, alternatively, predetermined) wavelength spectrum including the first wavelength ($\lambda_1$). FIG. 4 is a graph showing one example of a light absorbance spectrum of the photoelectric conversion layer in the combination sensor of FIG. 3. For example, the first wavelength ($\lambda_1$) may for example belong to ("may be within") a wavelength spectrum of about 750 nm to about 3000 nm, a wavelength spectrum of about 780 nm to about 1000 nm, a wavelength spectrum of about 780 nm to about 900 nm, a wavelength spectrum of about 780 nm to about 840 nm, a wavelength spectrum of about 800 nm to about 830 nm, a wavelength spectrum of about 805 nm to about 815 nm, or a wavelength spectrum of about 810 nm.

The infrared light in a particular (or, alternatively, predetermined) wavelength spectrum that is absorbed by the photoelectric conversion layer 32 may be for example a region exhibiting an absorption spectrum having the first wavelength ($\lambda_1$) as a peak and may be for example a region of the first wavelength ($\lambda_1$) ±150 nm, the first wavelength ($\lambda_1$) ±120 nm, the first wavelength ($\lambda_1$) ±100 nm, the first wavelength ($\lambda_1$) ±80 nm, the first wavelength ($\lambda_1$) ±70 nm, or the first wavelength ($\lambda_1$) ±50 nm, but is not limited thereto.

The photoelectric conversion layer 32 may have (e.g., may be associated with) an absorptance at the first wavelength ($\lambda_1$), where the absorptance may be greater than or equal to about 50%, for example greater than or equal to about 60%, greater than or equal to about 70%, greater than or equal to about 75%, greater than or equal to about 80%, greater than or equal to about 85%, greater than or equal to about 88%, greater than or equal to about 90%, greater than or equal to about 92%, greater than or equal to about 95%, greater than or equal to about 97%, greater than or equal to about 98%, greater than or equal to about 99%, greater than or equal to about 99.5%, greater than or equal to about 99.9%, or about 100%.

On the other hand, the photoelectric conversion layer 32 may not substantially absorb (e.g., may not absorb within manufacturing tolerances and/or material tolerances) light of the second wavelength ($\lambda_2$) and transmit light of the second wavelength ($\lambda_2$). The photoelectric conversion layer 32 may have (e.g., may be associated with) a transmittance at the second wavelength ($\lambda_2$), where the transmittance may be greater than or equal to about 50%, for example greater than or equal to about 60%, greater than or equal to about 70%, greater than or equal to about 75%, greater than or equal to about 80%, greater than or equal to about 85%, greater than or equal to about 88%, greater than or equal to about 90%, greater than or equal to about 92%, greater than or equal to about 95%, greater than or equal to about 97%, greater than or equal to about 98%, greater than or equal to about 99%, greater than or equal to about 99.5%, greater than or equal to about 99.9%, or about 100%.

The photoelectric conversion layer 32 may have a full width at half maximum (FWHM) of less than or equal to about 200 nm. Herein, the full width at half maximum (FWHM) indicates the width of a wavelength range corresponding to a half of a maximum absorption point, and a small full width at half maximum (FWHM) indicates selective absorption of light in a narrow wavelength spectrum and thus high wavelength selectivity. The photoelectric conversion layer 32 may for example have a FWHM of about 50 nm to about 200 nm, about 50 nm to about 180 nm, about 50 nm to about 150 nm, about 50 nm to about 130 nm, about 50 nm to about 120 nm, about 50 nm to about 110 nm, or about 50 nm to about 100 nm.

The photoelectric conversion layer 32 (e.g., the first light absorbing material) may include a p-type semiconductor and an n-type semiconductor and the p-type semiconductor and the n-type semiconductor may form a pn junction.

At least one of the p-type semiconductor and the n-type semiconductor may include a light absorbing material configured to selectively absorb infrared light in a particular (or, alternatively, predetermined) wavelength spectrum including the first wavelength ($\lambda_1$). The p-type semiconductor and the n-type semiconductor may independently include an organic material, an inorganic material, and/or an organic/inorganic material. At least one of the p-type semiconductor and the n-type semiconductor may include an organic material selectively absorbing infrared light in a particular (or, alternatively, predetermined) region including the first wavelength ($\lambda_1$), a semiconductor nanocrystal such as a quantum dot selectively absorbing infrared light in a particular (or, alternatively, predetermined) region including the first wavelength ($\lambda_1$), or a combination thereof. Accordingly, it will be understood that the photoelectric conversion layer 32 may include a (first) light absorbing material, and the light absorbing material may include an organic material configured to selectively absorbing infrared light including the first wavelength, a semiconductor nanocrystal configured to selectively absorbing infrared light including the first wavelength, or a combination thereof.

At least one of the p-type semiconductor and the n-type semiconductor may include a material absorbing infrared light of the first wavelength ($\lambda_1$) such as a quantum dot, a quinoid metal complex compound, a cyanine compound, an immonium compound, a diimmonium compound, a triarylmethane compound, a dipyrromethene compound, a diquinone compound, a naphthoquinone compound, an anthraquinone compound, a squarylium compound, a rylene compound, a phthalocyanine compound, a naphthalocyanine compound, a perylene compound, a squaraine compound, a boron-dipyrromethene compound, a nickel-dithiol complex, merocyanine, diketopyrrolopyrroles, a croconium compound, a derivative thereof, or a combination thereof.

The p-type semiconductor may include the foregoing compounds and the n-type semiconductor may be for example fullerene such as C60 or C70, non-fullerene, thiophene, a derivative thereof, or a combination thereof, but are not limited thereto.

The photoelectric conversion layer 32 may be a single layer or a multilayer. The photoelectric conversion layer 32 may be for example an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within the range, an exciton may be effectively produced and a pn junction may be effectively formed.

The p-type layer may include the p-type semiconductor, and the n-type layer may include the n-type semiconductor.

The photoelectric conversion layer 32 may have a thickness of about 1 nm to about 500 nm. Within the range, the photoelectric conversion layer 32 may have for example a thickness of about 5 nm to about 300 nm or about 5 nm to about 200 nm.

The photoelectric conversion layer 32 may be formed at the whole surface of the combination sensor 300. Thereby, as the infrared light of a particular (or, alternatively, predetermined) wavelength spectrum including the first wavelength ($\lambda_1$) may be selectively absorbed at the whole surface of the combination sensor 300, the light area may be increased to provide high light absorbing efficiency.

The photoelectric conversion layer 32 may include a first light absorbing material configured to selectively absorb the infrared light in a particular (or, alternatively, predetermined) wavelength spectrum including the first wavelength ($\lambda_1$) to generate excitons, then the generated excitons may be separated into holes and electrons, and then separated holes transfer to an anode that is one of the lower electrode 31 and the upper electrode 33 and separated electrons transfer to a cathode that is one of the lower electrode 31 and the upper electrode 33 to provide a photoelectric conversion effect. The separated electrons and/or holes may be collected in the charge storage 230.

An auxiliary layer (not shown) may be further included between the lower electrode 31 and the photoelectric conversion layer 32 and/or between the upper electrode 33 and the photoelectric conversion layer 32. The auxiliary layer may be a charge auxiliary layer, a light absorbing auxiliary layer, or a combination thereof, but is not limited thereto.

The auxiliary layer may be for example at least one of a hole injection layer for facilitating hole injection, a hole transport layer for facilitating hole transport, an electron blocking layer for preventing electron transport, an electron injection layer for facilitating electron injection, an electron transport layer for facilitating electron transport, and a hole blocking layer for preventing hole transport.

The auxiliary layer may include for example an organic material, an inorganic material, or an organic/inorganic material. The organic material may be an organic material having hole or electron characteristics and the inorganic material may be for example a metal oxide such as a molybdenum oxide, a tungsten oxide, or a nickel oxide, but are not limited thereto.

The second infrared light sensor 200 may be integrated in the semiconductor substrate 210 and may be a photo-sensing device. As shown in FIG. 3, the second infrared light sensor 200 may be enclosed within the internal volume of the semiconductor substrate 210, such that the second infrared light sensor 200 is within the interior of the semiconductor substrate 210 and is thus "integrated" in the semiconductor substrate 210.

The semiconductor substrate 210 may be for example a silicon substrate and is integrated with the second infrared light sensor 200, the charge storage 230, and a transmission transistor (not shown).

The second infrared light sensor 200 may be a photodiode and may be configured to sense entered light, and sensed information may be transferred by the transmission transistor. Herein, the light entered into the second infrared light sensor 200 is light that passes the dual bandpass filter 40 and the first infrared light sensor 100 and may be light in a particular (or, alternatively, predetermined) wavelength spectrum including the second wavelength ($\lambda_2$). The light in a particular (or, alternatively, predetermined) region including the first wavelength ($\lambda_1$) may be entirely absorbed by the photoelectric conversion layer 32 and may not reach the second infrared light sensor 200. In this case, a separate filter for wavelength selectivity of the light entered into the second infrared light sensor 200 is not separately needed. However, for the time when the light in a particular (or, alternatively, predetermined) wavelength spectrum including the first wavelength ($\lambda_1$) is not entirely absorbed by the photoelectric conversion layer 32, a separate filter between the second infrared light sensor 200 and the first infrared light sensor 100 may be further disposed.

The second wavelength ($\lambda_2$) may for example belong to ("may be within") a wavelength spectrum of about 750 nm to about 3000 nm, a wavelength spectrum of about 780 nm to about 1000 nm, a wavelength spectrum of about 830 nm to about 1000 nm, a wavelength spectrum of about 910 nm to about 970 nm, a wavelength spectrum of about 930 nm to about 950 nm, a wavelength spectrum of about 935 nm to about 945 nm, or a wavelength spectrum of about 940 nm. The charge storage 230 is electrically connected to the first infrared light sensor 100.

A metal wire (not shown) and a pad (not shown) are formed under or on the second infrared light sensor 200. In order to decrease signal delay, the metal wire and pad may be made of a metal having low resistivity, for example, aluminum (Al), copper (Cu), silver (Ag), and alloys thereof, but are not limited thereto.

An insulation layer 250 is formed between the first infrared light sensor 100 and the second infrared light sensor 200. The insulation layer 250 may be made of an inorganic insulating material such as a silicon oxide and/or a silicon nitride, or a low dielectric constant (low K) material such as SiC, SiCOH, SiCO, and SiOF. The insulation layer 250 may have a trench 85 exposing the charge storage 230. The trench 85 may be filled with fillers.

A focusing lens (not shown) may be further formed on the dual bandpass filter 40. The focusing lens may control a direction of incident light and gather the light in one region. The focusing lens may have a shape of, for example, a cylinder or a hemisphere, but is not limited thereto.

According to some example embodiments, the dual bandpass filter 40 at the front surface of the combination sensor 300 may be configured to selectively transmit infrared light in a particular (or, alternatively, predetermined) region including the first wavelength ($\lambda_1$) and the second wavelength ($\lambda_2$) out of incident light, wherein the infrared light in a particular (or, alternatively, predetermined) region including the first wavelength ($\lambda_1$) may be configured to be selectively absorbed and photoelectrically converted by the first infrared light sensor 100 that is a photoelectric conversion device as one sensor, while the infrared light in a particular (or, alternatively, predetermined) region including the second wavelength ($\lambda_2$) may be configured to be sensed by the second infrared light sensor 200 that is a photo-sensing device as another sensor.

Accordingly, these two sensors respectively performing a separately different function are included together and thus may work as a combination sensor and in addition, are stacked in each pixel and thus may maintain a size but twice increase the number of pixel functioning as each sensor and resultantly, much improve sensitivity.

Figure 5:
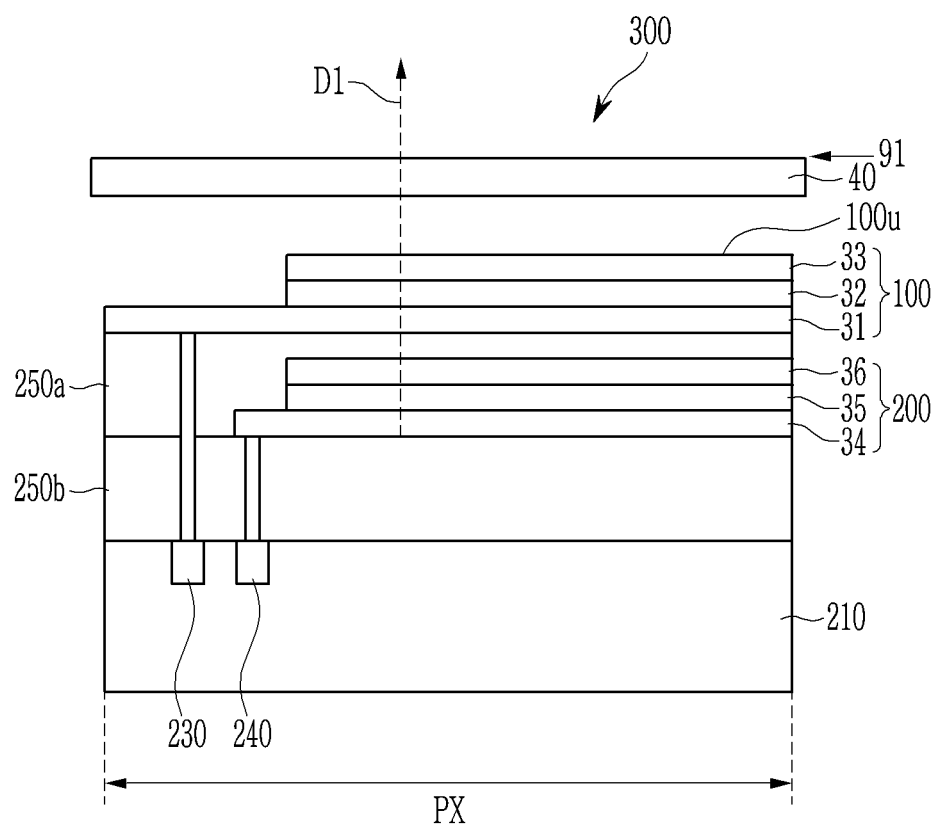
FIG. 5 is a schematic cross-sectional view showing a structure according to some example embodiments of the combination sensor of FIG. 2.

FIG. 5 is a schematic cross-sectional view showing a structure according to some example embodiments of the combination sensor of FIG. 2.

Referring to FIG. 5, a combination sensor 300 according to some example embodiments includes a first infrared light sensor 100, a second infrared light sensor 200, and a dual bandpass filter 40, wherein the first infrared light sensor 100 is a photoelectric conversion device absorbing and photoelectrically converting infrared light including a first wavelength ($\lambda_1$), and the second infrared light sensor 200 is a photoelectric conversion device absorbing and photoelectrically converting infrared light including a second wavelength ($\lambda_2$). In some example embodiments, equivalent constituent elements of some example embodiments are the same as described in the example embodiments and will not be repetitively illustrated. As shown in FIG. 5, at least the first and second infrared light sensors 100 and 200 are stacked with regard to each other. As referred to herein, where the first infrared light sensor 100 and the second infrared light sensor 200 that are referred to as being stacked, it will be understood that the first infrared light sensor 100 and the second infrared light sensor 200 are stacked in a vertical direction D1 that extends orthogonal or substantially orthogonal to an upper surface 100U of the first infrared light sensor 100, such that the first infrared light sensor 100 and the second infrared light sensor 200 overlap in the vertical direction D1.

The combination sensor 300 according to some example embodiments includes the first infrared light sensor 100, an insulation layer 250a, the second infrared light sensor 200, an insulation layer 250b, and a semiconductor substrate 210.

The first infrared light sensor 100 includes a lower electrode 31 and an upper electrode 33 facing each other and a photoelectric conversion layer 32 between the lower electrode 31 and the upper electrode 33, like some example embodiments.

The photoelectric conversion layer 32 may include a first light absorbing material configured to selectively absorb infrared light in a particular (or, alternatively, predetermined) region including the first wavelength ($\lambda_1$). The first wavelength ($\lambda_1$) may for example belong to ("may be within") a wavelength spectrum of about 750 nm to about 3000 nm, a wavelength spectrum of about 780 nm to 1000 nm, a wavelength spectrum of about 780 nm to about 900 nm, a wavelength spectrum of about 780 nm to about 840 nm, a wavelength spectrum of about 800 nm to about 830 nm, a wavelength spectrum of about 805 nm to about 815 nm, or a wavelength spectrum of about 810 nm.

The second infrared light sensor 200 includes a lower electrode 34 (a "third electrode") and an upper electrode 36 ("fourth electrode") facing each other and a photoelectric conversion layer 35 (a "second photoelectric conversion layer') between the lower electrode 34 and the upper electrode 36.

One of the lower electrode 34 and the upper electrode 36 is an anode and the other is a cathode. The lower electrode 34 and the upper electrode 36 may be all light-transmitting electrodes.

The photoelectric conversion layer 35 may include a second light absorbing material configured to selectively absorb light in a particular (or, alternatively, predetermined) region (e.g., infrared light) including the second wavelength ($\lambda_2$). For example, the second wavelength ($\lambda_2$) may for example belong to ("may be within") a wavelength spectrum of about 750 nm to about 3000 nm, a wavelength spectrum of about 780 nm to about 1000 nm, a wavelength spectrum of about 830 nm to about 1000 nm, a wavelength spectrum of about 910 nm to about 970 nm, a wavelength spectrum of about 930 nm to about 950 nm, a wavelength spectrum of about 935 nm to about 945 nm, or a wavelength spectrum of about 940 nm.

The photoelectric conversion layer 35 (e.g., the second light absorbing material) may include a p-type semiconductor and an n-type semiconductor and the p-type semiconductor and the n-type semiconductor may form a pn junction.

At least one of the p-type semiconductor and the n-type semiconductor may include a light absorbing material configured to selectively absorb infrared light in a particular (or, alternatively, predetermined) wavelength spectrum including the second wavelength ($\lambda_2$). The p-type semiconductor and the n-type semiconductor may independently include an organic material, an inorganic material, and/or an organic/inorganic material. At least one of the p-type semiconductor and the n-type semiconductor may include an organic material selectively absorbing infrared light in a particular (or, alternatively, predetermined) region including the second wavelength ($\lambda_2$), a semiconductor nanocrystal such as a quantum dot selectively absorbing infrared light in a particular (or, alternatively, predetermined) region including the second wavelength ($\lambda_2$), or a combination thereof. Accordingly, it will be understood that the photoelectric conversion layer 35 may include a (second) light absorbing material, and the light absorbing material may include an organic material configured to selectively absorbing infrared light including the second wavelength, a semiconductor nanocrystal configured to selectively absorbing infrared light including the second wavelength, or a combination thereof.

The infrared light in a particular (or, alternatively, predetermined) region that is absorbed by the photoelectric conversion layer 35 may be a region exhibiting an absorption spectrum having the second wavelength ($\lambda_2$) as a peak and may be for example a region of the second wavelength ($\lambda_2$) ±150 nm, the second wavelength ($\lambda_2$) ±120 nm, the second wavelength ($\lambda_2$) ±100 nm, the second wavelength ($\lambda_2$) ±80 nm, the second wavelength ($\lambda_2$) ±70 nm, or the second wavelength ($\lambda_2$) ±50 nm, but is not limited thereto.

The photoelectric conversion layer 35 may have a full width at half maximum (FWHM) of less than or equal to about 200 nm. The photoelectric conversion layer 35 may for example have a FWHM of about 50 nm to about 200 nm, about 50 nm to about 180 nm, about 50 nm to about 150 nm, about 50 nm to about 130 nm, about 50 nm to about 120 nm, about 50 nm to about 110 nm, or about 50 nm to about 100 nm.

The photoelectric conversion layer 35 may include a p-type semiconductor and an n-type semiconductor and the p-type semiconductor and the n-type semiconductor may form a pn junction. At least one of the p-type semiconductor and the n-type semiconductor may include a light absorbing material selectively absorbing infrared light in a particular (or, alternatively, predetermined) region including the second wavelength ($\lambda_2$). The p-type semiconductor and the n-type semiconductor are the same as described above.

The photoelectric conversion layer 35 may be a single layer or a multilayer. The photoelectric conversion layer 35 may be for example an intrinsic layer (I layer), a p-type layer/I layer, an I layer/n-type layer, a p-type layer/I layer/n-type layer, a p-type layer/n-type layer, and the like.

The photoelectric conversion layer 35 may have a thickness of about 1 nm to about 500 nm. Within the range, the photoelectric conversion layer 35 may have for example a thickness of about 5 nm to about 300 nm or about 5 nm to about 200 nm.

The photoelectric conversion layer 35 may be formed at the whole surface of the combination sensor 300. Thereby, as the infrared light in a particular (or, alternatively, predetermined) wavelength spectrum including the second wavelength ($\lambda_2$) may be selectively absorbed at the whole surface of the combination sensor 300, the light area may be increased to provide high light absorbing efficiency.

The photoelectric conversion layer 35 may selectively absorb the infrared light in a particular (or, alternatively, predetermined) wavelength spectrum including the second wavelength ($\lambda_2$) to generate excitons, then the generated excitons may be separated into holes and electrons, and then separated holes transfer to an anode that is one of the lower electrode 34 and the upper electrode 36 and separated electrons transfer to a cathode that is one of the lower electrode 34 and the upper electrode 36 to provide a photoelectric effect. The separated electrons and/or holes may be collected in the charge storage 240.

An auxiliary layer (not shown) may be further included between the lower electrode 34 and the photoelectric conversion layer 35 and/or between the upper electrode 36 and the photoelectric conversion layer 35. The auxiliary layer may be a charge auxiliary layer, a light absorbing auxiliary layer, or a combination thereof, but is not limited thereto.

The semiconductor substrate 210 may be for example a silicon substrate and is integrated with a transmission transistor (not shown) and the charge storages 230 and 240. A metal wire (not shown) and a pad (not shown) are formed on or under the semiconductor substrate 210.

A focusing lens (not shown) may be further formed on the dual bandpass filter 40.

According to some example embodiments, the dual bandpass filter 40 at the front surface may be configured to selectively transmit infrared light in a particular (or, alternatively, predetermined) wavelength spectrum including the first wavelength ($\lambda_1$) and the second wavelength ($\lambda_2$) out of incident light, wherein the infrared light in a particular (or, alternatively, predetermined) wavelength spectrum including the first wavelength ($\lambda_1$) may be selectively absorbed and photoelectrically converted by the first infrared light sensor 100 as one sensor, and the infrared light in a particular (or, alternatively, predetermined) wavelength spectrum including the second wavelength ($\lambda_2$) may be selectively absorbed and photoelectrically converted by the second infrared light sensor 200 as another sensor.

Accordingly, these two sensors respectively performing a separately different function are included together and thus may work as a combination sensor and in addition, are stacked in each pixel and thus may maintain a size but twice increase the number of pixel functioning as each sensor and resultantly, much improve sensitivity.

Hereinafter, a combination sensor according to some example embodiments is illustrated.

Figure 6:
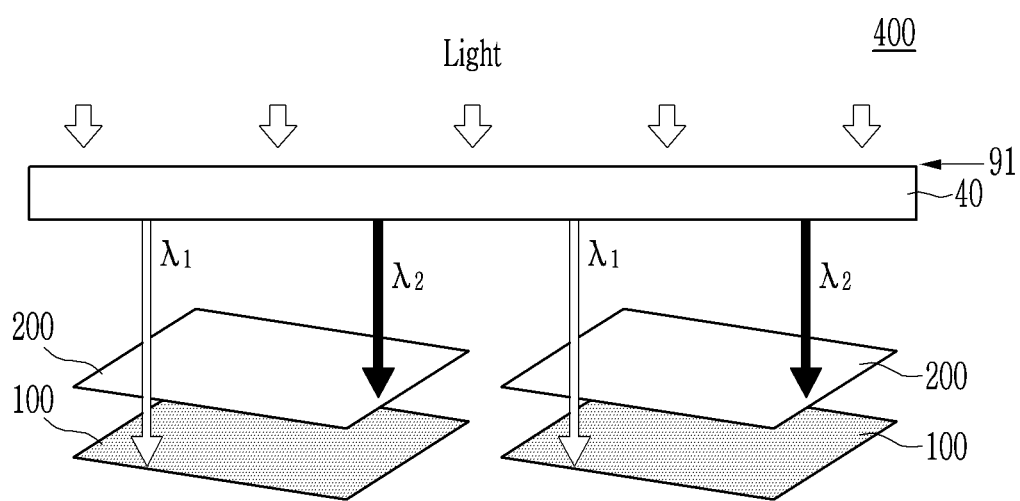
FIG. 6 is a schematic view showing a combination sensor according to some example embodiments corresponding to a section taken along the line II-II of FIG. 1.

FIG. 6 is a schematic view showing a combination sensor 400 according to some example embodiments.

Referring to FIG. 6, the combination sensor 400 according to some example embodiments includes a first infrared light sensor 100, a second infrared light sensor 200, and a dual bandpass filter 40 like some example embodiments. However, the combination sensor 400 according to some example embodiments may include the first infrared light sensor 100 under the second infrared light sensor 200.

The first infrared light sensor 100 and the second infrared light sensor 200 may be stacked and the same structure may be included in each pixel (PX).

The first infrared light sensor 100 and the second infrared light sensor 200 may independently be a photoelectric conversion device (photoelectric device) or a photo-sensing device such as a photodiode.

The first infrared light sensor 100 and the second infrared light sensor 200 may be independently a biometric sensor. One of the first infrared light sensor 100 and the second infrared light sensor 200 may be an iris sensor and the other of the first infrared light sensor 100 and the second infrared light sensor 200 may be a depth sensor. For example, the first infrared light sensor 100 may be an iris sensor and the second infrared light sensor 200 may be a depth sensor.

Figure 7:
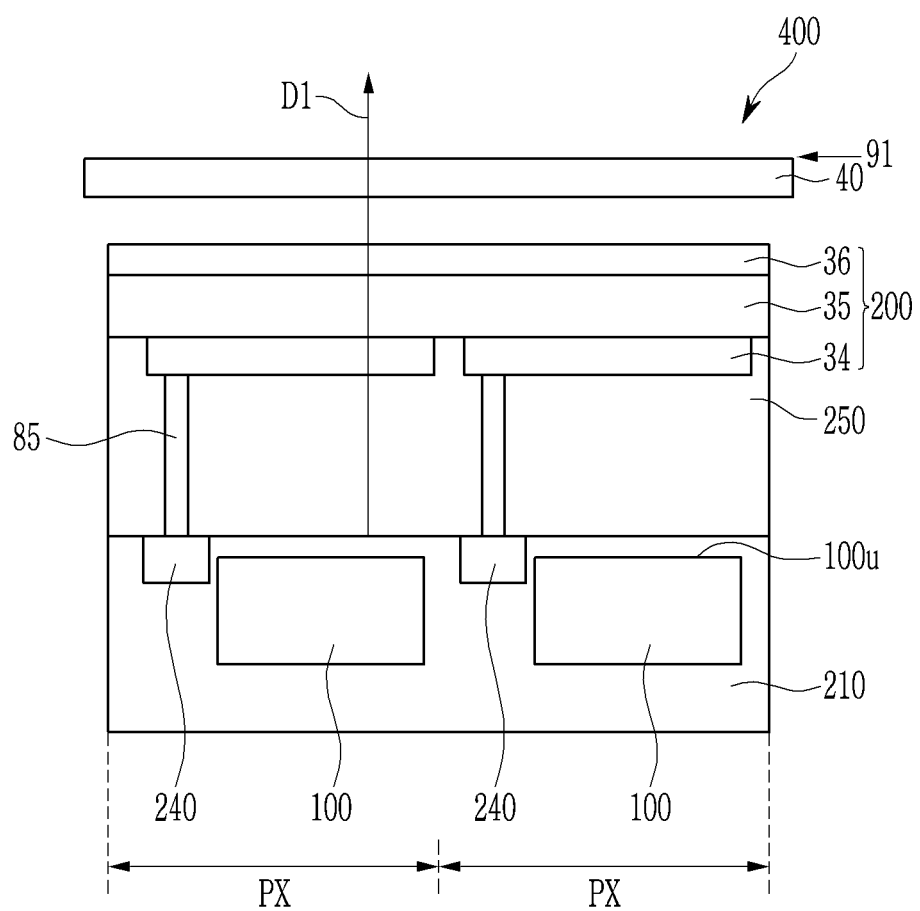
FIG. 7 is a schematic cross-sectional view showing a structure according to some example embodiments of the combination sensor of FIG. 6.
Figure 8:
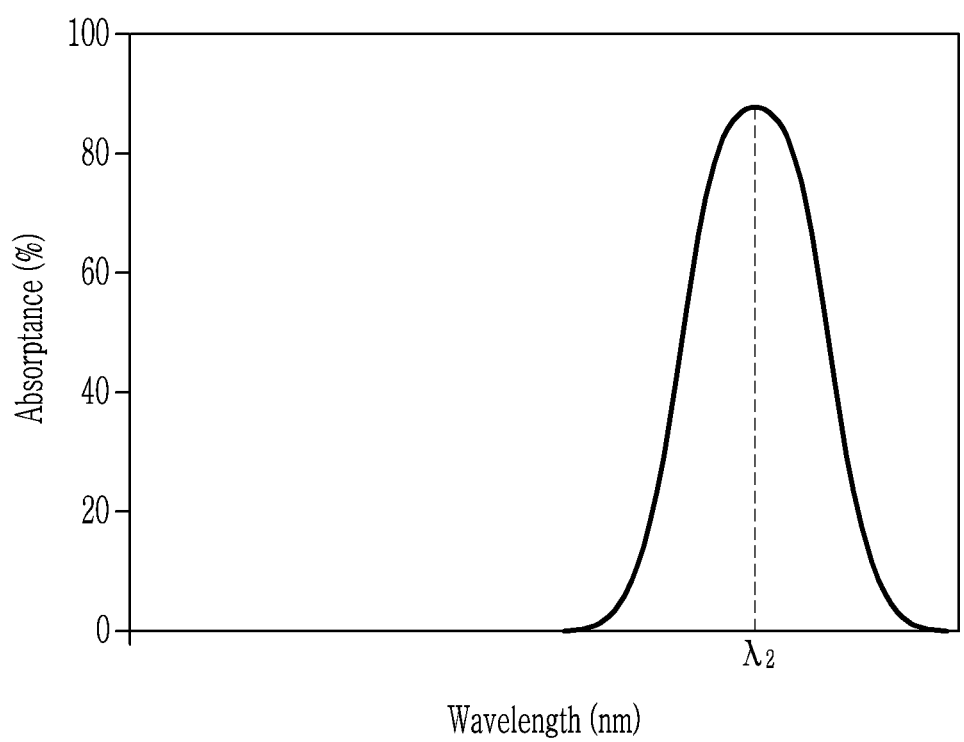
FIG. 8 is a graph showing one example of a light absorbance spectrum of the photoelectric conversion layer of the second infrared light sensor in the combination sensor of FIG. 7.

FIG. 7 is a schematic cross-sectional view showing a structure according to some example embodiments of the combination sensor of FIG. 6. FIG. 8 is a graph showing one example of a light absorbance spectrum of the photoelectric conversion layer of the second infrared light sensor in the combination sensor of FIG. 7.

Referring to FIG. 7, a combination sensor 400 according to some example embodiments includes a first infrared light sensor 100 and a second infrared light sensor 200 that are stacked, and a dual bandpass filter 40. As shown in FIG. 7, at least the first and second infrared light sensors 100 and 200 are stacked with regard to each other. As referred to herein, where the first infrared light sensor 100 and the second infrared light sensor 200 that are referred to as being stacked, it will be understood that the first infrared light sensor 100 and the second infrared light sensor 200 are stacked in a vertical direction D1 that extends orthogonal or substantially orthogonal to an upper surface 100U of the first infrared light sensor 100, such that the first infrared light sensor 100 and the second infrared light sensor 200 overlap in the vertical direction D1. The second infrared light sensor 200 may be a photoelectric conversion device that absorbs and photoelectrically converts infrared light including the second wavelength ($\lambda_2$) and the first infrared light sensor 100 may be a photo-sensing device. The photo-sensing device may be configured to sense light that passes the dual bandpass filter 40 and the second infrared light sensor 200, that is, infrared light including the first wavelength ($\lambda_2$). In some example embodiments, equivalent constituent elements of some example embodiments to those of some example embodiments are the same as described in the example embodiments and will not be repetitively illustrated.

An absorptance at the second wavelength ($\lambda_2$) of the photoelectric conversion layer 35 may be greater than or equal to about 50%, for example greater than or equal to about 60%, greater than or equal to about 70%, greater than or equal to about 75%, greater than or equal to about 80%, greater than or equal to about 85%, greater than or equal to about 88%, greater than or equal to about 90%, greater than or equal to about 92%, greater than or equal to about 95%, greater than or equal to about 97%, greater than or equal to about 98%, greater than or equal to about 99%, greater than or equal to about 99.5%, greater than or equal to about 99.9%, or greater than or equal to about 100%.

On the other hand, the photoelectric conversion layer 35 may not substantially absorb e.g., may not absorb within manufacturing tolerances and/or material tolerances) light in ("associated with") the first wavelength ($\lambda_1$) and may transmit light in the first wavelength ($\lambda_1$). A transmittance at the first wavelength ($\lambda_1$) of the photoelectric conversion layer 35 may be greater than or equal to about 50%, for example greater than or equal to about 60%, greater than or equal to about 70%, greater than or equal to about 75%, greater than or equal to about 80%, greater than or equal to about 85%, greater than or equal to about 88%, greater than or equal to about 90%, greater than or equal to about 92%, greater than or equal to about 95%, greater than or equal to about 97%, greater than or equal to about 98%, greater than or equal to about 99%, greater than or equal to about 99.5%, greater than or equal to about 99.9%, or about 100%.

The photoelectric conversion layer 35 may be formed at the whole surface of the combination sensor 400. Thereby, as the infrared light in a particular (or, alternatively, predetermined) wavelength spectrum including the second wavelength ($\lambda_2$) may be selectively absorbed at the whole surface of the combination sensor 400, the light area may be increased to provide high light absorbing efficiency.

The photoelectric conversion layer 35 may selectively absorb the infrared light in a particular (or, alternatively, predetermined) wavelength spectrum including the second wavelength ($\lambda_2$) to generate excitons, then the generated excitons may be separated into holes and electrons, and then separated holes transfer to an anode that is one of the lower electrode 34 and the upper electrode 36 and separated electrons transfer to a cathode that is one of the lower electrode 34 and the upper electrode 36 to provide a photoelectric effect. The separated electrons and/or holes may be collected in the charge storage 240.

An auxiliary layer (not shown) may be further included between the lower electrode 34 and the photoelectric conversion layer 35 and/or between the upper electrode 36 and the photoelectric conversion layer 35. The auxiliary layer may be a charge auxiliary layer, a light absorbing auxiliary layer, or a combination thereof, but is not limited thereto.

The first infrared light sensor 100 may be a photo-sensing device and may be integrated in the semiconductor substrate 210. As shown in FIG. 7, the first infrared light sensor 100 may be enclosed within the internal volume of the semiconductor substrate 210, such that the first infrared light sensor 100 is within the interior of the semiconductor substrate 210 and is thus "integrated" in the semiconductor substrate 210.

The semiconductor substrate 210 may be for example a silicon substrate and is integrated with the first infrared light sensor 100, the charge storage 240, and a transmission transistor (not shown).

The first infrared light sensor 100 may be a photodiode and may be configured to sense entered light, and sensed information may be transferred by the transmission transistor. Herein, the light entered into the first infrared light sensor 100 may be light that passes the dual bandpass filter 40 and the second infrared light sensor 200 and may be light in a particular (or, alternatively, predetermined) wavelength spectrum including the first wavelength ($\lambda_1$). The light in a particular (or, alternatively, predetermined) wavelength spectrum including the second wavelength ($\lambda_2$) may be entirely absorbed by the photoelectric conversion layer 35 and may not reach the first infrared light sensor 100. In this case, a separate filter for wavelength selectivity of the light entered into the first infrared light sensor 100 may be not separately needed. However, for the time when the light in a particular (or, alternatively, predetermined) wavelength spectrum including the second wavelength ($\lambda_2$) is not entirely absorbed by the photoelectric conversion layer 35, a separate filter between the first infrared light sensor 100 and the second infrared light sensor 200 may be further disposed.

The first wavelength ($\lambda_1$) may for example belong to a wavelength spectrum of about 750 nm to about 3000 nm, a wavelength spectrum of about 780 nm to 1000 nm, a wavelength spectrum of about 780 nm to about 900 nm, a wavelength spectrum of about 780 nm to about 840 nm, a wavelength spectrum of about 800 nm to about 830 nm, a wavelength spectrum of about 805 nm to about 815 nm, or a wavelength spectrum of about 810 nm.

The charge storage 240 is electrically connected to the second infrared light sensor 200.

A metal wire (not shown) and a pad (not shown) are formed under or on the first infrared light sensor 100. In order to decrease signal delay, the metal wire and pad may be made of a metal having low resistivity, for example, aluminum (Al), copper (Cu), silver (Ag), and alloys thereof, but are not limited thereto.

An insulation layer 250 is formed between the first infrared light sensor 100 and the second infrared light sensor 200. The insulation layer 250 may be made of an inorganic insulating material such as a silicon oxide and/or a silicon nitride, or a low dielectric constant (low K) material such as SiC, SiCOH, SiCO, and SiOF. The insulation layer 250 may have a trench 85 exposing the charge storage 240. The trench 85 may be filled with fillers.

A focusing lens (not shown) may be further formed on the dual bandpass filter 40.

According to some example embodiments, the dual bandpass filter 40 at the front surface may be selectively transmit infrared light in a particular (or, alternatively, predetermined) wavelength spectrum including the first wavelength ($\lambda_1$) and the second wavelength ($\lambda_2$) out of incident light, wherein the infrared light in a particular (or, alternatively, predetermined) wavelength spectrum including the first wavelength ($\lambda_1$) may be selectively absorbed and photoelectrically converted by the first infrared light sensor 100, and the infrared light in a particular (or, alternatively, predetermined) region including the second wavelength ($\lambda_2$) may be selectively absorbed and photoelectrically converted by the second infrared light sensor 200.

Accordingly, these two sensors respectively performing a separately different function are included together and thus may work as a combination sensor and in addition, are stacked in each pixel and thus may maintain a size but twice increase the number of pixel functioning as each sensor and resultantly, much improve sensitivity.

Figure 9:
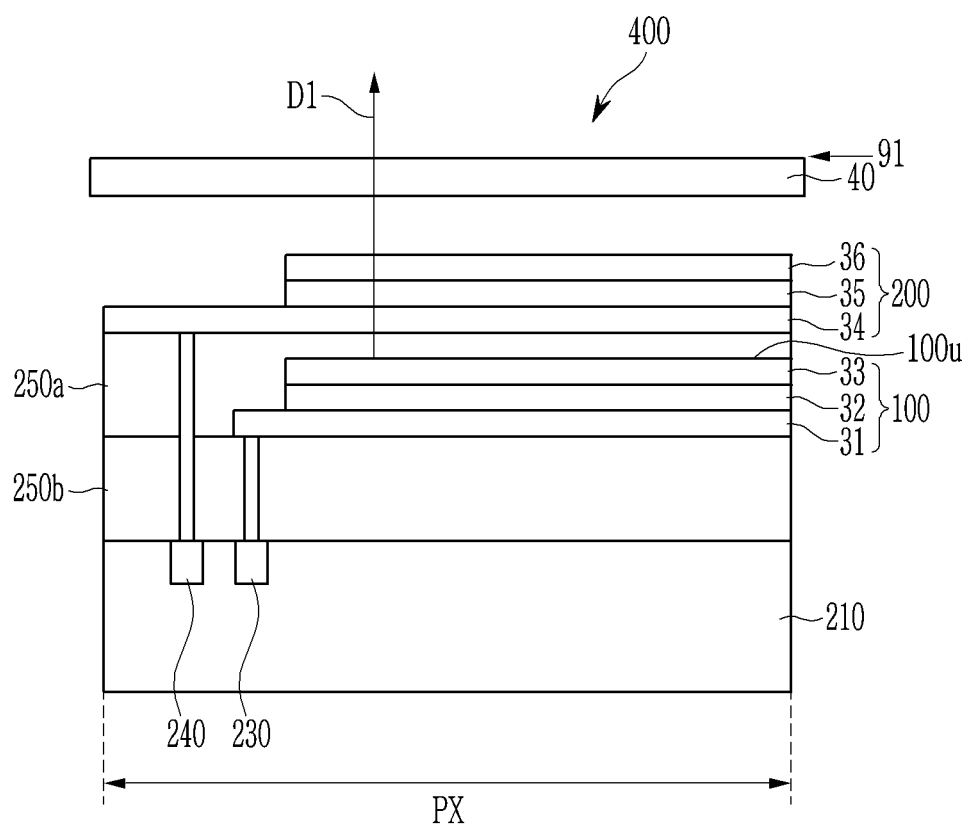
FIG. 9 is a schematic cross-sectional view showing a structure according to some example embodiments of the combination sensor of FIG. 6.

FIG. 9 is a schematic cross-sectional view showing a structure according to some example embodiments of the combination sensor of FIG. 6.

Referring to FIG. 9, a combination sensor 400 according to some example embodiments includes a first infrared light sensor 100, a second infrared light sensor 200 on a first infrared light sensor 100, and a dual bandpass filter 40, wherein the first infrared light sensor 100 is a photoelectric conversion device absorbing and photoelectrically converting infrared light including a first wavelength ($\lambda_1$), and the second infrared light sensor 200 is a photoelectric conversion device absorbing and photoelectrically converting infrared light including a second wavelength ($\lambda_2$). In some example embodiments, equivalent constituent elements of some example embodiments to those of some example embodiments are the same as described in the example embodiments and will not be repetitively illustrated. As shown in FIG. 9, at least the first and second infrared light sensors 100 and 200 are stacked with regard to each other. As referred to herein, where the first infrared light sensor 100 and the second infrared light sensor 200 that are referred to as being stacked, it will be understood that the first infrared light sensor 100 and the second infrared light sensor 200 are stacked in a vertical direction D1 that extends orthogonal or substantially orthogonal to an upper surface 100U of the first infrared light sensor 100, such that the first infrared light sensor 100 and the second infrared light sensor 200 overlap in the vertical direction D1.

The photoelectric conversion layer 35 may be formed at the whole surface of the combination sensor 400. Thereby, as the infrared light in a particular (or, alternatively, predetermined) region including the second wavelength ($\lambda_2$) may be selectively absorbed at the whole surface of the combination sensor 400, the light area may be increased to provide high light absorbing efficiency.

The photoelectric conversion layer 35 may selectively absorb the infrared light in a particular (or, alternatively, predetermined) region including the second wavelength ($\lambda_2$) to generate excitons, then the generated excitons may be separated into holes and electrons, and then separated holes transfer to an anode that is one of the lower electrode 34 and the upper electrode 36 and separated electrons transfer to a cathode that is one of the lower electrode 34 and the upper electrode 36 to provide a photoelectric effect. The separated electrons and/or holes may be collected in the charge storage 240.

An auxiliary layer (not shown) may be further included between the lower electrode 34 and the photoelectric conversion layer 35 and/or between the upper electrode 36 and the photoelectric conversion layer 35. The auxiliary layer may be a charge auxiliary layer, a light absorbing auxiliary layer, or a combination thereof, but is not limited thereto.

The first infrared light sensor 100 includes a lower electrode 31 and an upper electrode 33 facing each other and a photoelectric conversion layer 32 between the lower electrode 31 and the upper electrode 33.

The photoelectric conversion layer 32 may selectively absorb infrared light in a particular (or, alternatively, predetermined) region including the first wavelength ($\lambda_1$). The first wavelength ($\lambda_1$) may for example belong to a wavelength spectrum of about 750 nm to about 3000 nm, a wavelength spectrum of about 780 nm to about 1000 nm, a wavelength spectrum of about 780 nm to about 900 nm, a wavelength spectrum of about 780 nm to about 840 nm, a wavelength spectrum of about 800 nm to about 830 nm, a wavelength spectrum of about 805 nm to about 815 nm, or a wavelength spectrum of about 810 nm.

The infrared light in a particular (or, alternatively, predetermined) wavelength spectrum that is absorbed by the photoelectric conversion layer 32 may be a region exhibiting an absorption spectrum having the first wavelength ($\lambda_1$) as a peak and may be for example a region of the first wavelength ($\lambda_1$) ±150 nm, the first wavelength ($\lambda_1$) ±120 nm, the first wavelength ($\lambda_1$) ±100 nm, the first wavelength ($\lambda_1$) ±80 nm, the first wavelength ($\lambda_1$) ±70 nm, or the first wavelength ($\lambda_1$) ±50 nm, but is not limited thereto.

The photoelectric conversion layer 32 may have a full width at half maximum (FWHM) of less than or equal to about 200 nm. The photoelectric conversion layer 32 may for example have a FWHM of about 50 nm to about 200 nm, about 50 nm to about 180 nm, about 50 nm to about 150 nm, about 50 nm to about 130 nm, about 50 nm to about 120 nm, about 50 nm to about 110 nm, or about 50 nm to about 100 nm.

The photoelectric conversion layer 32 may include a p-type semiconductor and an n-type semiconductor. At least one of the p-type semiconductor and the n-type semiconductor may include a light absorbing material selectively absorbing infrared light in a particular (or, alternatively, predetermined) region including the first wavelength ($\lambda_1$). At least one of the p-type semiconductor and the n-type semiconductor may include an organic material, a semiconductor nanocrystal such as a quantum dot, or a combination thereof that selectively absorbs infrared light in a particular (or, alternatively, predetermined) region including the first wavelength ($\lambda_1$).

The photoelectric conversion layer 32 may selectively absorb the infrared light in a particular (or, alternatively, predetermined) region including the first wavelength ($\lambda_1$) to generate excitons, then the generated excitons may be separated into holes and electrons, and then separated holes transfer to an anode that is one of the lower electrode 31 and the upper electrode 33 and separated electrons transfer to a cathode that is one of the lower electrode 31 and the upper electrode 33. The separated electrons and/or holes may be collected in the charge storage 230.

An auxiliary layer (not shown) may be further included between the lower electrode 31 and the photoelectric conversion layer 32 and/or between the upper electrode 33 and the photoelectric conversion layer 32. The auxiliary layer may be a charge auxiliary layer, a light absorbing auxiliary layer, or a combination thereof, but is not limited thereto.

The semiconductor substrate 210 may be for example a silicon substrate and is integrated with a transmission transistor (not shown) and the charge storages 230 and 240. A metal wire (not shown) and a pad (not shown) are formed on or under the semiconductor substrate 210.

A focusing lens (not shown) may be further formed on the dual bandpass filter 40.

According to some example embodiments, the dual bandpass filter 40 at the front surface may be configured to selectively transmit infrared light in a particular (or, alternatively, predetermined) wavelength spectrum including the first wavelength ($\lambda_1$) and the second wavelength ($\lambda_2$) out of incident light, wherein the infrared light in a particular (or, alternatively, predetermined) wavelength spectrum including the first wavelength ($\lambda_1$) may be selectively absorbed and photoelectrically converted by the first infrared light sensor 100 as one sensor, and the infrared light in a particular (or, alternatively, predetermined) region including the second wavelength ($\lambda_2$) may be selectively absorbed and photoelectrically converted by the second infrared light sensor 200 as another sensor.

Accordingly, these two sensors respectively performing a separately different function are included together and thus may work as a combination sensor and in addition, are stacked in each pixel and thus may maintain a size but twice increase the number of pixel functioning as each sensor and resultantly, much improve sensitivity.

The combination sensor may be applied to various electronic devices, and the electronic devices may include for example a camera, a camcorder, a mobile phone internally having them, a display device, a security device, or a medical device, but are not limited thereto.

Figure 10:
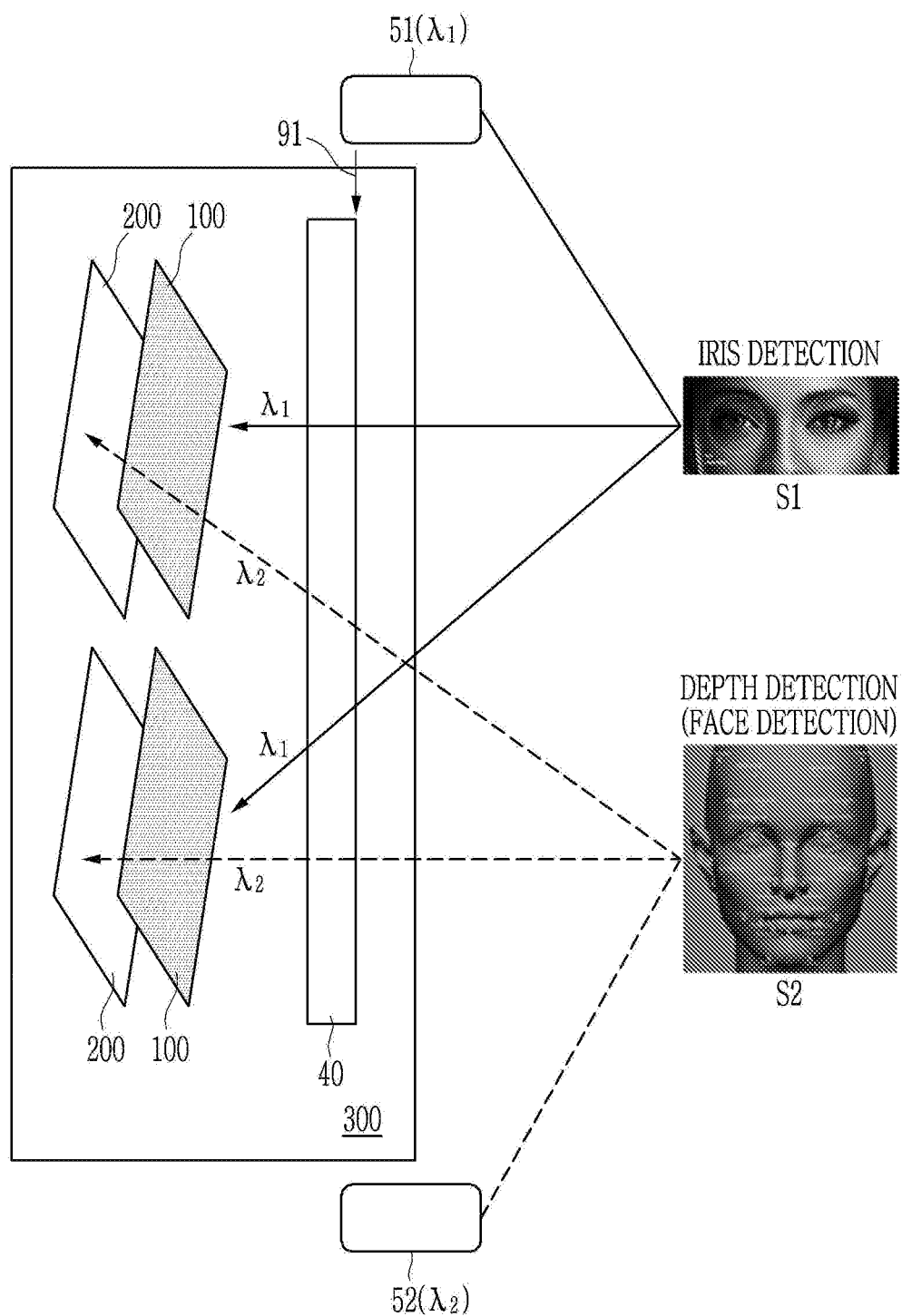
FIG. 10 is a schematic view showing some example embodiments of an electronic device.

FIG. 10 is a schematic view showing some example embodiments of an electronic device.

Referring to FIG. 10, an electronic device according to some example embodiments includes a light source 51 configured to irradiate light of ("associated with") a first wavelength ($\lambda_1$), a light source 52 configured to irradiate light of ("associated with") a second wavelength ($\lambda_2$), a first infrared light sensor 100 configured to sense the light of the first wavelength ($\lambda_1$) reflected from a first object (S1), and a second infrared light sensor 200 configured to sense the light of the second wavelength ($\lambda_2$) reflected from a second object (S2). In some example embodiments, at least light source 51 may be configured to irradiate light of the first wavelength ($\lambda_1$) and the second wavelength ($\lambda_2$).

The first infrared light sensor 100 and the second infrared light sensor 200 are stacked and then, included in each pixel. On the first infrared light sensor 100 and the second infrared light sensor 200, a dual bandpass filter 40 may be further included. The first wavelength ($\lambda_1$) and the second wavelength ($\lambda_2$) respectively belong to an infrared wavelength spectrum but are different from each other as described above and specifically, the same as described above. FIG. 10 shows two light sources 51 and 52 respectively irradiating infrared light of the first wavelength ($\lambda_1$) and the second wavelength ($\lambda_2$), but these two light sources 51 and 52 may be replaced by one light source all irradiating the infrared light of the first wavelength ($\lambda_1$) and the second wavelength ($\lambda_2$).

The first object (S1) may be for example an iris, and the first infrared light sensor 100 may be for example an iris sensor. The second object (S2) may have for example a three-dimensional shape such as a face, and the second infrared light sensor 200 may be a depth sensor such as a face recognition sensor.

Light of the first wavelength ($\lambda_1$) irradiated from the light source 51 may reach the first object (S1) like an iris and then, may be reflected therefrom, configured to sense by the first infrared light sensor 100 such as an iris sensor, and compared with an image already stored therein to perform a sensing function such as an iris recognition.

Likewise, light of the second wavelength ($\lambda_2$) irradiated from the light source 52 may reach the second object (S2) and then may be reflected at a plurality of points of the second object (S2) having a three-dimensional shape and then, configured to sense by the second infrared light sensor 200 such as a depth sensor to perform a sensing function such as a face recognition.

Figure 11:
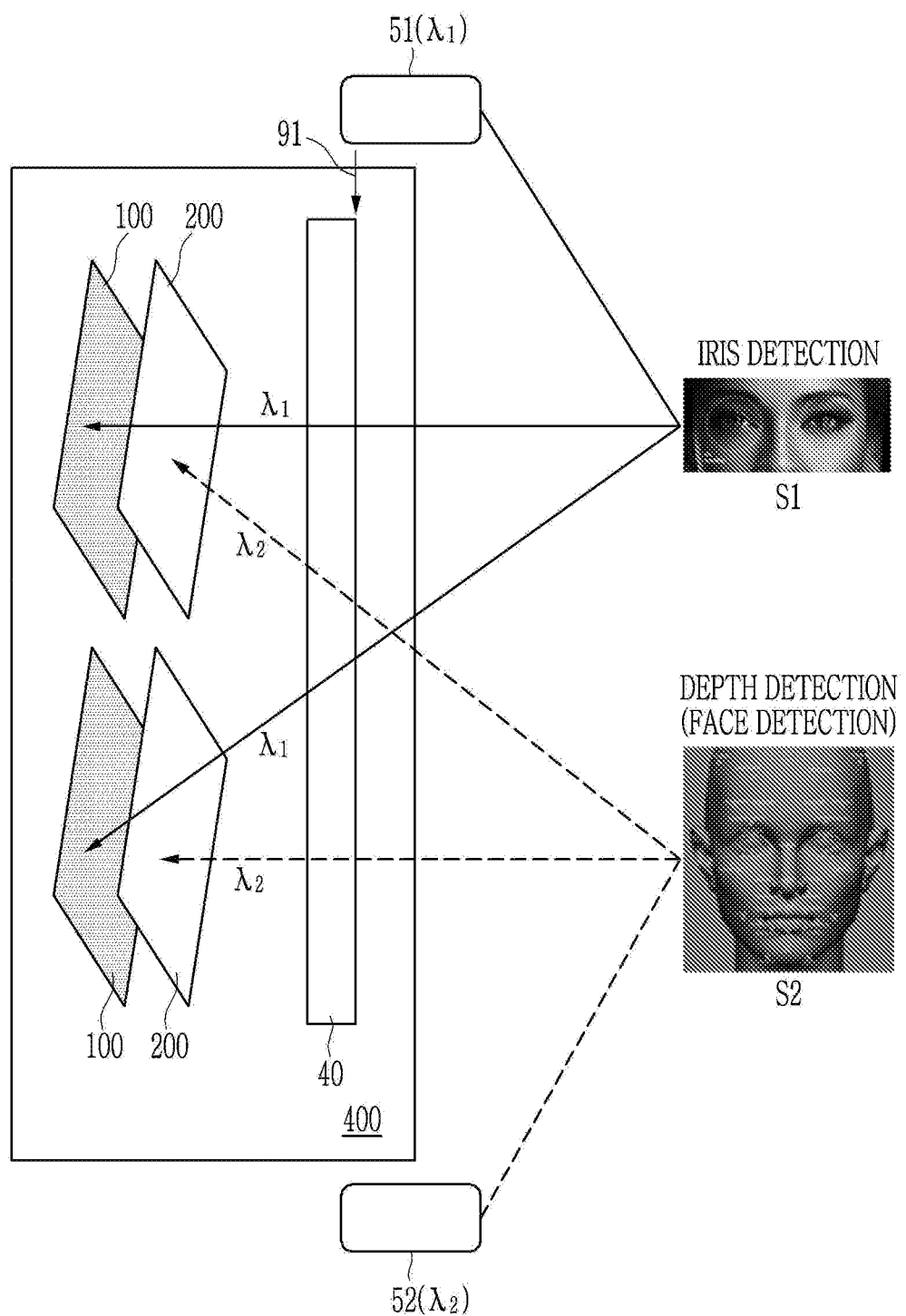
FIG. 11 is a schematic view showing some example embodiments of an electronic device.

FIG. 11 is a schematic view showing some example embodiments of an electronic device.

Referring to FIG. 11, an electronic device according to some example embodiments includes a light source 51 configured to irradiate light of a first wavelength ($\lambda_1$), a light source 52 configured to irradiate light of a second wavelength ($\lambda_2$), a first infrared light sensor 100 configured to sense the light of the first wavelength ($\lambda_1$) reflected from a first object (S1), and a second infrared light sensor 200 configured to sense the light of the second wavelength ($\lambda_2$) reflected from a second object (S2) like some example embodiments. However, the electronic device according to the present inventive concepts may include the first infrared light sensor 100 under the second infrared light sensor 200.

The electronic device according to some example embodiments includes the first infrared light sensor 100 and the second infrared light sensor 200 stacked in one pixel to simultaneously function as an iris sensor and a depth sensor in each pixel like in the electronic device according to some example embodiments and accordingly, may maintain the same size but include twice as many pixels functioning as a sensor as before and resultantly show much improved sensitivity like in some example embodiments.

Figure 12:
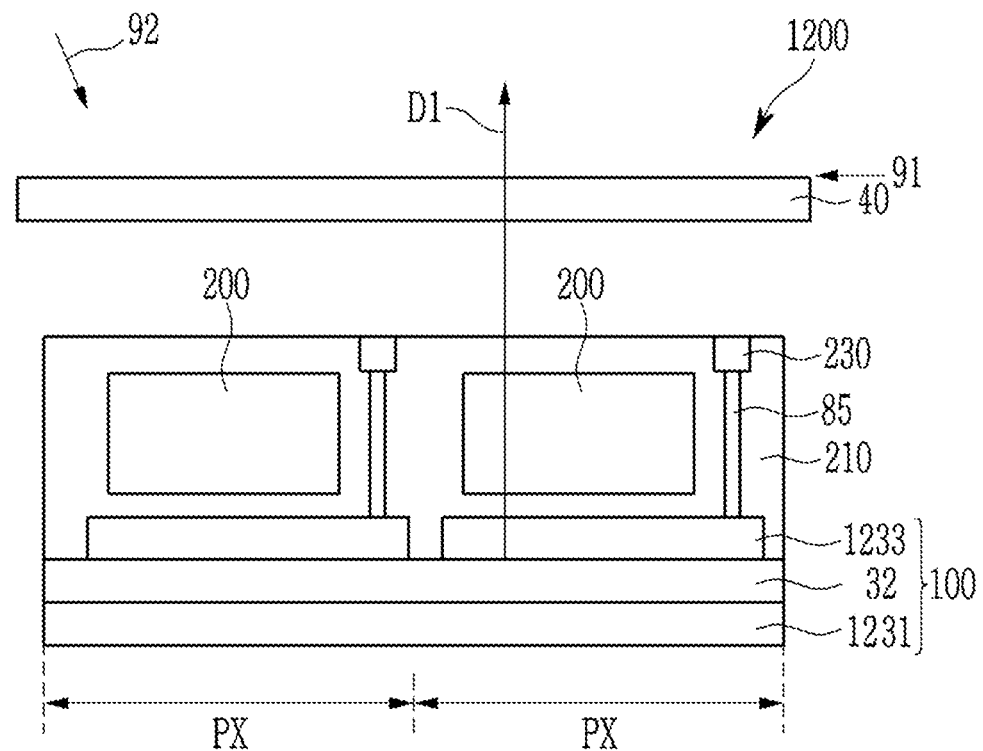
FIG. 12 is a schematic view showing a combination sensor according to some example embodiments.

FIG. 12 is a schematic view showing a combination sensor according to some example embodiments.

Referring to FIG. 12, an combination sensor 1200 according to some example embodiments includes a first infrared light sensor 100 and a second infrared light sensor 200, where the first and second infrared light sensors 100 and 200 are stacked in the vertical direction D1, the second infrared light sensors 200 include photo-sensing devices integrated with semiconductor substrate 210, the first infrared light sensor 100 includes an upper electrode 1233 ("first electrode") and a lower electrode 1231 ("second electrode") facing each other and a photoelectric conversion layer 32 ("first photoelectric conversion layer") between the upper electrode 1233 and the lower electrode 1231, where the combination sensor 1200 includes a light incidence side 91 (i.e., a side of the combination sensor 1200 that is proximate to a source of incident light 92 in relation to the semiconductor substrate 210, for example as shown in FIG. 12), and where the second infrared light sensor 200 is between the first infrared light sensor 100 and the light incidence side 91, such that the first infrared light sensor 100 is distal from the light incidence side 91 in relation to the second infrared light sensor 200, and the semiconductor substrate 210 may have a trench 85 exposing the charge storage 230. The trench 85 may be filled with fillers.

Figure 13:
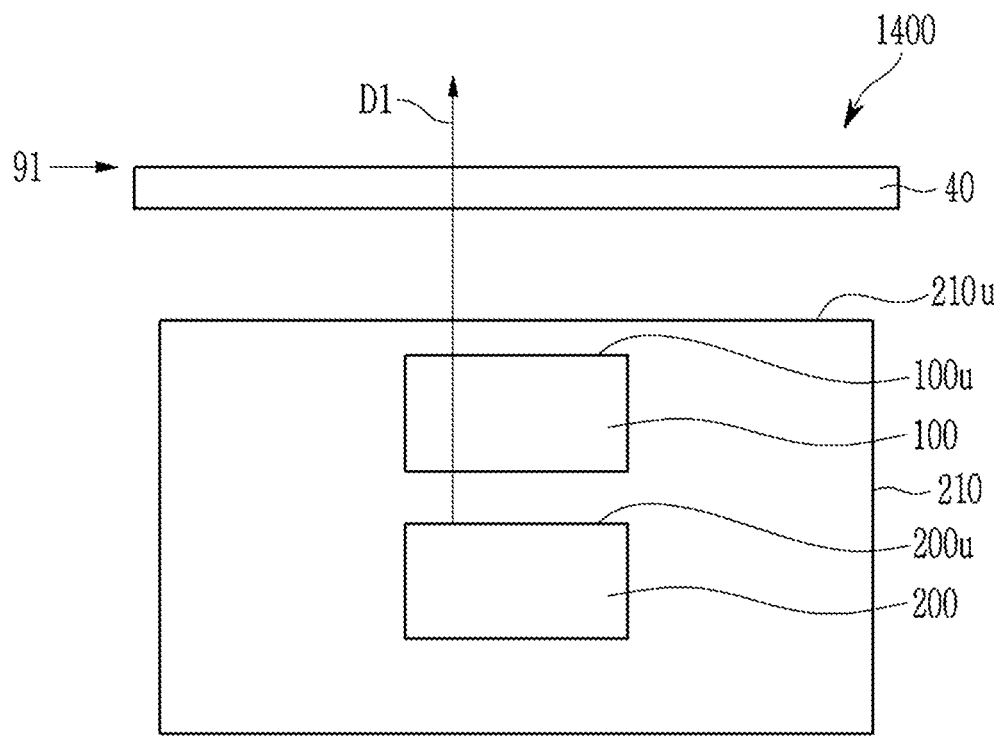
FIG. 13 is a schematic view showing a combination sensor according to some example embodiments.

FIG. 13 is a schematic view showing a combination sensor according to some example embodiments.

In the combination sensor 1400 of FIG. 13, the first infrared light sensor 100 and the second infrared light sensor 200 are each photo-sensing devices and are stacked in the vertical direction D1 within the semiconductor substrate 210, such that the upper surface 1000 of the first infrared light sensor 100 is proximate to the upper surface 210U of the semiconductor substrate 210 in relation to the upper surface 200U of the second infrared light sensor 200, where the first and second infrared light sensors 100 and 200 vertically overlap (e.g., overlap in the vertical direction D1). In some example embodiments, the first infrared light sensor 100 may sense infrared light associated with a first wavelength that is within in a shorter wavelength spectrum than the wavelength spectrum of the second wavelength of infrared light that may be sensed by the second infrared light sensor 200, based on the first infrared light sensor 100 being proximate to the upper surface 210U of the semiconductor substrate 210, and thus proximate to the light incident side 91 of the combination sensor 1400, in relation to the second infrared light sensor 200.

Figure 14:
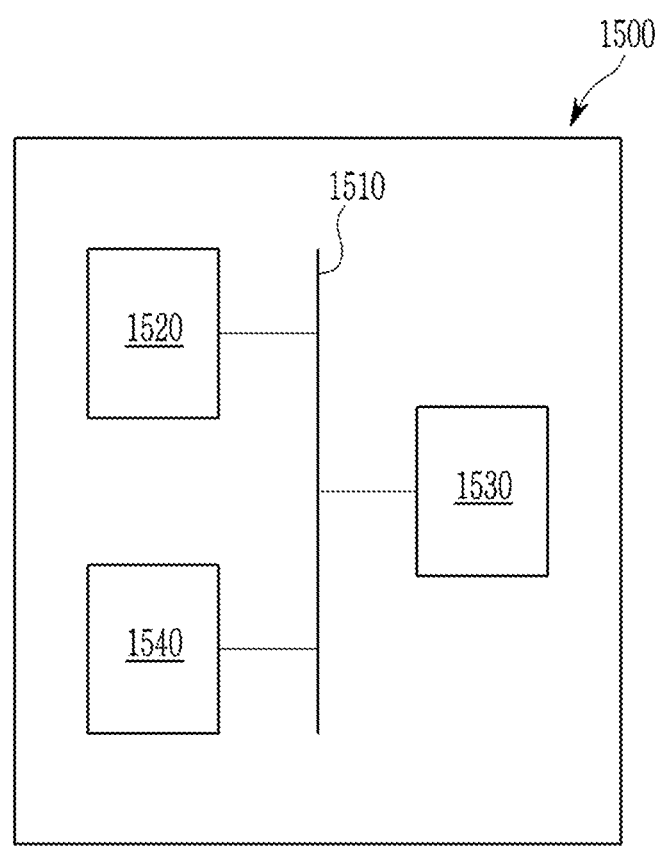
FIG. 14 is a schematic diagram of an electronic device according to some example embodiments.

FIG. 14 is a schematic diagram of an electronic device 1500 according to some example embodiments. The electronic device 1500 may include any of the electronic devices in any of the example embodiments.

As shown in FIG. 14, an electronic device 1500 may include a processor 1520, a memory 1530, and a sensor 1540 that are electrically coupled together via a bus 1510. The sensor 1540 may be a combination sensor of any of the example embodiments as described herein. The memory 1530, which may be a non-transitory computer readable medium, may store a program of instructions. The processor 1520 may execute the stored program of instructions to perform one or more functions. For example, the processor 1520 may be configured to process electric signals generated by the sensor 1540. The processor 1520 may be configured to generate an output (e.g., an image to be displayed on a display interface) based on processing the electric signals.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. A combination sensor, comprising:
   a first infrared light sensor configured to sense light associated with a first wavelength within an infrared wavelength spectrum; and
   a second infrared light sensor configured to sense light associated with a second wavelength within the infrared wavelength spectrum,
   wherein the first infrared light sensor and the second infrared light sensor are stacked in relation to each other,
   wherein the first wavelength is a shorter wavelength than the second wavelength,
   wherein the first wavelength is within a wavelength spectrum of about 780 nm to about 900 nm, and
   wherein the second wavelength is within a wavelength spectrum of about 830 nm to about 1000 nm.

2. The combination sensor of claim 1, wherein
   a difference between the first wavelength and the second wavelength is greater than or equal to about 30 nm.

3. The combination sensor of claim 1, wherein
   the first wavelength is within a wavelength spectrum of about 780 nm to about 840 nm, and
   the second wavelength is within a wavelength spectrum of about 910 nm to about 970 nm.

4. The combination sensor of claim 1, wherein the first infrared light sensor includes
   a first electrode and a second electrode facing each other, and
   a first photoelectric conversion layer between the first electrode and the second electrode, the first photoelectric conversion layer including a first light absorbing material configured to selectively absorb infrared light including the first wavelength.

5. The combination sensor of claim 4, wherein the first light absorbing material includes
   an organic material configured to selectively absorb infrared light including the first wavelength,
   a semiconductor nanocrystal configured to selectively absorb infrared light including the first wavelength, or
   a combination thereof.

6. The combination sensor of claim 4, wherein
   the first photoelectric conversion layer is associated with an absorptance at the first wavelength that is greater than or equal to about 50%, and the first photoelectric conversion layer is associated with a transmittance at the second wavelength that is greater than or equal to about 50%.

7. The combination sensor of claim 4, wherein the second infrared light sensor is a photo-sensing device integrated in a semiconductor substrate.

8. The combination sensor of claim 4, wherein the second infrared light sensor includes
a third electrode and a fourth electrode facing each other, and
a second photoelectric conversion layer between the third electrode and the fourth electrode, the second photoelectric conversion layer including a second light absorbing material configured to selectively absorb infrared light including the second wavelength.

9. The combination sensor of claim 8, wherein the second light absorbing material included in the second photoelectric conversion layer includes
an organic material configured to selectively absorb infrared light including the second wavelength,
a semiconductor nanocrystal configured to selectively absorb infrared light including the second wavelength, or
a combination thereof.

10. The combination sensor of claim 1, wherein the second infrared light sensor includes
a first electrode and a second electrode facing each other, and
a first photoelectric conversion layer between the first electrode and the second electrode, the first photoelectric conversion layer including a light absorbing material configured to selectively absorb infrared light including the second wavelength.

11. The combination sensor of claim 10, wherein the light absorbing material included in the first photoelectric conversion layer includes
an organic material configured to selectively absorb infrared light including the second wavelength,
a semiconductor nanocrystal configured to selectively absorb infrared light including the second wavelength, or
a combination thereof.

12. The combination sensor of claim 10, wherein
the first photoelectric conversion layer is associated with an absorptance at the second wavelength that is greater than or equal to about 50%, and
the first photoelectric conversion layer is associated with a transmittance at the first wavelength that is greater than or equal to about 50%.

13. The combination sensor of claim 10, wherein the first infrared light sensor is a photo-sensing device integrated in a semiconductor substrate.

14. The combination sensor of claim 10, wherein the first infrared light sensor includes
a third electrode and a fourth electrode facing each other, and
a second photoelectric conversion layer between the third electrode and the fourth electrode, the second photoelectric conversion layer including a second light absorbing material configured to selectively absorb infrared light including the first wavelength.

15. The combination sensor of claim 14, wherein the second light absorbing material included in the second photoelectric conversion layer includes
an organic material configured to selectively absorb infrared light including the first wavelength,
a semiconductor nanocrystal configured to selectively absorb infrared light including the first wavelength, or
a combination thereof.

16. The combination sensor of claim 1, wherein at least one infrared light sensor of the first infrared light sensor and the second infrared light sensor includes
a first electrode and a second electrode facing each other, and
a photoelectric conversion layer between the first electrode and the second electrode, the photoelectric conversion layer including a light absorbing material configured to selectively absorb
infrared light including the first wavelength, or
infrared light including the second wavelength.

17. The combination sensor of claim 1, wherein the first infrared light sensor and the second infrared light sensor are stacked in a vertical direction that extends substantially orthogonal to an upper surface of the first infrared light sensor, such that the first infrared light sensor and the second infrared light sensor overlap in the vertical direction.

18. The combination sensor of claim 1, further comprising:
a dual bandpass filter configured to selectively transmit infrared light including the first wavelength and the second wavelength.

19. The combination sensor of claim 1, wherein
the combination sensor includes a plurality of pixels, and
each pixel of the plurality of pixels includes the first infrared light sensor and the second infrared light sensor.

20. The combination sensor of claim 1, wherein each infrared light sensor of the first infrared light sensor and the second infrared light sensor is a biometric sensor.

21. The combination sensor of claim 1, wherein
the first infrared light sensor is an iris sensor, and
the second infrared light sensor is a depth sensor.

22. A combination sensor, comprising:
a plurality of pixels,
wherein each pixel includes an iris sensor and a depth sensor,
wherein the iris sensor is configured to selectively sense infrared light including a first wavelength within a wavelength spectrum of about 780 nm to about 900 nm, and
wherein the depth sensor is configured to selectively sense infrared light including a second wavelength within a wavelength spectrum of about 830 nm to about 1000 nm.

23. The combination sensor of claim 22, wherein the iris sensor and the depth sensor are stacked.

24. The combination sensor of claim 23, wherein at least one sensor of the iris sensor and the depth sensor includes
a first electrode and a second electrode facing each other, and
a photoelectric conversion layer between the first electrode and the second electrode, the photoelectric conversion layer including a light absorbing material configured to selectively absorb infrared light including the first wavelength or infrared light including the second wavelength.

25. An electronic device comprising the combination sensor of claim 1.

26. An electronic device comprising the combination sensor of claim 22.

27. An electronic device, comprising:
at least one light source configured to irradiate light of a first wavelength and light of a second wavelength that is different from the first wavelength;
a first sensor configured to sense reflected light of the first wavelength; and
a second sensor stacked with the first sensor and configured to sense reflected light of the second wavelength,
wherein the first wavelength is a shorter wavelength than the second wavelength,
wherein the first wavelength is within a wavelength spectrum of about 780 nm to about 900 nm, and
wherein the second wavelength is within a wavelength spectrum of about 830 nm to about 1000 nm.

28. The electronic device of claim 27, wherein the at least one light source includes a first light source configured to irradiate light of the first wavelength and a second light source to irradiate light of the second wavelength.

29. The electronic device of claim 27, wherein
a difference between the first wavelength and the second wavelength is greater than or equal to about 30 nm.

30. The electronic device of claim 27, wherein
the first wavelength is within a wavelength spectrum of about 780 nm to about 840 nm,
the second wavelength is within a wavelength spectrum of about 910 nm to about 970 nm.

* * * * *